(12) United States Patent
Hosoda et al.

(10) Patent No.: US 8,018,145 B2
(45) Date of Patent: Sep. 13, 2011

(54) ORGANIC ELECTROLUMINESCENCE DEVICE

(75) Inventors: Hidemasa Hosoda, Kanagawa (JP); Takeharu Tani, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/712,567

(22) Filed: Feb. 25, 2010

(65) Prior Publication Data

US 2010/0225229 A1  Sep. 9, 2010

(30) Foreign Application Priority Data

Mar. 5, 2009  (JP) .................................. 2009-051961

(51) Int. Cl.
*H05B 33/00* (2006.01)
*H05B 33/14* (2006.01)

(52) U.S. Cl. ........................................ 313/504; 313/506

(58) Field of Classification Search .................. None
See application file for complete search history.

(56) References Cited

U.S. PATENT DOCUMENTS

| 6,762,553 | B1 * | 7/2004 | Yokogawa et al. ............ 313/509 |
| 2004/0135494 | A1 * | 7/2004 | Miyatake ...................... 313/501 |
| 2006/0186803 | A1 | 8/2006 | Lim et al. |
| 2009/0066220 | A1 * | 3/2009 | Handa et al. .................. 313/503 |
| 2009/0224660 | A1 * | 9/2009 | Nakanishi et al. ............ 313/504 |
| 2010/0194717 | A1 * | 8/2010 | Mori et al. .................... 345/204 |

FOREIGN PATENT DOCUMENTS

| EP | 1548856 | 6/2005 |
| JP | 2005-190931 | 7/2005 |

OTHER PUBLICATIONS

Extended European Search Report dated May 13, 2011, Application No. 10155309.7.

* cited by examiner

*Primary Examiner* — Ashok Patel
(74) *Attorney, Agent, or Firm* — Young & Thompson

(57) ABSTRACT

The present invention provides an organic electroluminescence display device including an organic electroluminescence element which includes a transparent electrode, a counter electrode, and an organic compound layer provided between these electrodes, the organic compound layer including a light emitting layer, and a fine particle containing layer positioned in the optical path of light emitted from the light emitting layer, wherein the fine particle containing layer contains an organic resin material, a first fine particle, and a second fine particle having a weight average particle diameter greater than that of the first fine particle, wherein a refractive index $n_1$ of the organic resin material into which the first fine particle is added and an average refractive index $n_2$ of the organic compound layer satisfy a relationship $|n_1-n_2|<0.25$, and wherein the refractive index $n_1$ and a refractive index $n_3$ of the second fine particle satisfy a relationship $n_3-n_1>0.2$.

9 Claims, 1 Drawing Sheet

ORGANIC ELECTROLUMINESCENCE DEVICE

BACKGROUND OF THE INVENTION

1. Field of the Invention

The present invention relates to an organic electroluminescence device excellent in light extraction efficiency.

2. Description of the Related Art

Organic electroluminescence display devices (organic EL display devices) are self-luminescence type display devices and are for use in display and illumination. The organic EL display has such advantages of display performance that it is high in visibility, and free from viewing angle dependency, as compared to conventional CRTs and LCDs, and also has advantages in that display devices can be made lighter and thinner. Meanwhile, organic EL illumination has advantages, in addition to enabling lighter and thinner devices, in possibility of achieving lighting fixture having a shape that has not yet been achieved so far, by using a flexible substrate.

The organic electroluminescence display devices have superior features as described above, but the refractive index of each of layers constituting a display device, including a light emitting layer, is higher than the refractive index of air. For instance, in an organic electroluminescence display device, an organic thin-film layer, such as a light emitting layer, has a refractive index of 1.6 to 2.1. Therefore, emitting light is liable to be totally reflected at an interface, and the light extraction efficiency is less than 20%. Thus, the majority of light is lost.

As measures for improving the light extraction efficiency, there has been proposed a method in which a diffusion layer is provided adjacent to a transparent electrode on a light extraction surface side, and at least two different types of fine particles, which are different in average particle diameter by one digit or more, are dispersed in a resin in the diffusion layer (for example, see Japanese Patent Application Laid-Open (JP-A) No. 2005-190931), and the like.

However, the method described above in No. 2005-190931 has a shortcoming in that the light extraction efficiency is still insufficient.

BRIEF SUMMARY OF THE INVENTION

The present invention aims to solve the above conventional problem and to achieve the following object.

More specifically, the present invention aims to provide an organic electroluminescence display device excellent in light extraction efficiency.

Means for solving the above problem are as follows.

<1> An organic electroluminescence display device including:

an organic electroluminescence element which includes a transparent electrode, a counter electrode, and an organic compound layer provided between the transparent electrode and the counter electrode, the organic compound layer including a light emitting layer, and a fine particle containing layer positioned in the optical path of light emitted from the light emitting layer, wherein the fine particle containing layer contains an organic resin material, a first fine particle, and a second fine particle having a weight average particle diameter greater than that of the first fine particle, wherein a refractive index $n_1$ of the organic resin material into which the first fine particle is added and an average refractive index $n_2$ of the organic compound layer satisfy a relationship $|n_1-n_2|<0.25$, and wherein the refractive index $n_1$ of the organic resin material into which the first fine particle is added and a refractive index $n_3$ of the second fine particle satisfy a relationship $n_3-n_1>0.2$.

<2> The organic electroluminescence display device according to <1>, wherein the second particle is an inorganic fine particle.

<3> The organic electroluminescence display device according to <2>, wherein the inorganic fine particle contains at least one selected from $TiO_2$, $ZnO$, and $ZrO_2$.

<4> The organic electroluminescence display device according to any one of <1> to <3>, wherein the fine particle containing layer has a thickness of less than 5 μm.

<5> The organic electroluminescence display device according to any one of <1> to <4>, wherein the fine particles in the fine particle containing layer are primary particles.

<6> The organic electroluminescence display device according to <5>, wherein the fine particles in the fine particle containing layer are surface-treated with an organic material.

<7> The organic electroluminescence display device according to any one of <1> to <6>, wherein the fine particle containing layer further contains a fine particle dispersant.

<8> The organic electroluminescence display device according to any one of <1> to <7>, wherein the weight average particle diameter of the first fine particle is less than 50 nm, and the weight average particle diameter of the second fine particle is 50 nm to 5 μm.

<9> The organic electroluminescence display device according to any one of <1> to <8>, wherein the organic resin material contains at least one selected from the group consisting of imide resins, acrylic resins, ether resins, and silane resins.

According to the present invention, it is possible to solve conventional problems and to provide an organic electroluminescence display device excellent in light extraction efficiency.

DETAILED DESCRIPTION OF THE INVENTION

Figure 1:
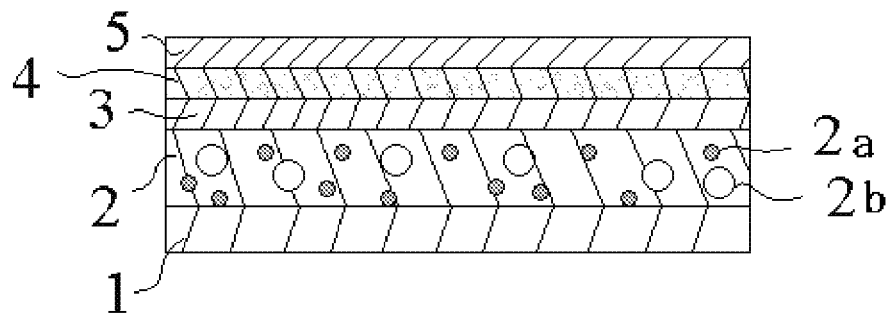
FIG. 1 is a view illustrating one example of a configuration of an organic electroluminescence display device according to the present invention.

Hereinafter, an organic electroluminescence display device according to the present invention will be described in detail.

(Organic Electroluminescence Display Device)

The organic electroluminescence display device includes at least an organic EL element and a fine particle containing layer, and further includes other members as required.

<Organic EL Element>

The organic EL element includes a cathode, an anode (a transparent electrode and a counter electrode), and an organic compound layer including a light emitting layer (an organic light emitting layer) between both of the electrodes. In terms of the properties of the light emitting element, at least one of the electrodes for the anode and cathode is preferably transparent.

As a configuration of the laminated organic compound layer, an aspect is preferable in which a hole transporting layer, an organic light emitting layer, and an electron transporting layer are stacked in this order as viewed from the anode side. The laminated organic compound layer further includes a hole injection layer between the hole transporting layer and the anode, and/or an electron transporting intermediate layer between the organic light emitting layer and the electron transporting layer. In addition, a hole transporting intermediate layer may be provided between the organic light emitting layer and the hole transporting layer. Similarly, an electron injection layer may be provided between the cathode and the electron transporting layer.

Note that each of these layers may have a plurality of secondary layers.

The organic light emitting layer corresponds to the light emitting layer, and the anode and cathode and the individual layers other than the organic light emitting layer respectively correspond to the above-mentioned other members.

<<Anode>>

The anode is generally sufficient to have the function of an electrode to supply holes to the organic compound layer. The shape, structure, and size of the anode are not particularly limited, and these may be arbitrarily selected from known materials of electrode in accordance with the intended use and purpose of the light emitting element. As described above, the anode is provided as the transparent anode.

Preferred examples of the material of the anode include metals, alloys, electrically conductive compounds and mixtures of these materials. Specific examples of the material of the anode include tin oxides doped with antimony, fluorine, etc. (ATO, FTO); electrically conductive metal oxides such as tin oxide, zinc oxide, indium oxide, indium tin oxide (ITO), and indium zinc oxide (IZO); metals such as gold, silver, chromium, and nickel, mixtures and laminates of these metals with electrically conductive metal oxides; inorganic electrically conductive materials such as copper iodide, and copper sulfide; organic electrically conductive materials such as polyaniline, polythiophene, and polypyrrole, and laminates of these organic electrically conductive materials with ITO, etc. Among these materials, preferred are electrically conductive metal oxides, and ITO is especially preferred from the viewpoint of productivity, high-conductivity, transparency and the like.

The anode can be formed on the substrate by a method arbitrarily selected from among wet-process methods such as a printing method, and a coating method; physical methods such as a vacuum vapor deposition method, a sputtering method, and an ion-plating method; and chemical methods such as a CVD method, and a plasma CVD method, taking the suitability with the material constituting the anode into consideration. For instance, if ITO is selected as the material of the anode, the anode can be formed according to a direct current or high-frequency sputtering method, a vacuum vapor deposition method, an ion-plating method, etc.

In the organic EL element, the position of the anode to be formed is not particularly limited, and the anode can be formed anywhere in accordance with the intended use and purpose of the light emitting element. The anode is however preferably formed on the substrate. In this case, the anode may be formed on the entire surface of one side of the substrate or may be formed at a part of the substrate.

In the formation of the anode, patterning of the anode may be carried out by chemical etching such as photo-lithography, may be carried out by physical etching with use of a laser, etc., may be carried out by vacuum vapor deposition or sputtering on a superposed mask, or a lift-off method or a printing method may be used.

The thickness of the anode can be optionally selected depending on the material constituting the anode, and cannot be unequivocally defined. However, it is usually about 10 nm to about 50 nm, preferably 50 nm to 20 µm.

The value of resistance of the anode is preferably $10^3$ Ω/square or lower, more preferably $10^2$ Ω/square or lower. When the anode is transparent, it may be color-less and transparent, or may be colored and transparent. In order to collect light from the transparent anode side, the transmittance of the anode is preferably 60% or higher, more preferably 70% or higher.

In connection with transparent anodes, detailed description is found in Yutaka Sawada supervised "*Tomei Denkyoku—Maku no Shintenkai* (New Developments of Transparent Electroconductive Films)" CMC Publishing Co., Ltd. (1999), and the description therein can be applied to the present invention. When a plastic substrate low in heat resistance is used, a transparent anode film formed with ITO or IZO at a low temperature of 150° C. or lower is preferred.

<<Cathode>>

The cathode is generally sufficient to have the function as an electrode to inject electrons to the organic compound layer. The shape, structure and size of the cathode are not particularly limited, and these can be arbitrarily selected from known materials of electrode in accordance with the intended use and purpose of the light emitting element.

Preferred examples of material constituting the cathode include metals, alloys, metal oxides, electrically conductive compounds and mixtures of these materials. Specific examples of the material of the cathode include alkali metals (e.g. Li, Na, K, Cs, etc.), alkaline earth metals (e.g. Mg, Ca, etc.), and rare earth metals such as gold, silver, lead, aluminum, sodium-potassium alloy, lithium-aluminum alloy, magnesium-silver alloy, indium, and ytterbium. These materials may be used alone, however, from the viewpoint of simultaneous achievement of stability and electron injection property, two or more materials can be preferably used in combination.

Among these, as the material constituting the cathode, alkali metals and alkaline earth metals are preferred in terms of the electron injecting property, and materials mainly containing aluminum are preferred for their excellent storage stability.

The materials mainly containing aluminum mean aluminum alone, alloys of aluminum with 0.01% by mass to 10% by mass of alkali metal or alkaline earth metal, or mixtures of these (e.g., lithium-aluminum alloy, magnesium-aluminum alloy, etc.).

The materials of the cathode are disclosed in detail in Japanese Patent Application Laid-Open (JP-A) Nos. 2-15595, and 5-121172, and the materials described therein can also be used in the present invention.

The cathode can be formed by known methods with no particular limitation. For example, the cathode can be formed according to a method arbitrarily selected from among wet-process methods such as a printing method, and a coating method; physical methods such as a vacuum vapor deposition method, a sputtering method, and an ion-plating method; and chemical methods such as a CVD method, and a plasma CVD method, taking the suitability with the material constituting the cathode in consideration. For example, in the case of selecting metals as the materials of the cathode, the cathode can be formed with one or two or more types of the materials at the same time or in order by a sputtering method, etc.

In the formation of the cathode, patterning of the cathode may be carried out by chemical etching such as photo-lithography, may be carried out by physical etching with use of a laser, etc., may be carried out by vacuum vapor deposition or sputtering on a superposed mask, or a lift-off method or a printing method may be used.

The position of the cathode to be formed is not especially limited and the cathode can be formed anywhere in the present invention. The cathode may be formed on the entire surface of the organic compound layer, or may be formed at a part thereof.

A dielectric layer composed of fluoride or oxide of alkali metal or alkaline earth metal may be inserted between the cathode and the organic layer in a thickness of from 0.1 nm to 5 nm. The dielectric layer can be regarded as a type of an electron-injecting layer. The dielectric layer can be formed by, for example, a vacuum deposition method, a sputtering method, an ion plating method, etc.

The thickness of the cathode can be arbitrarily selected depending on the material constituting the cathode, and cannot be unequivocally defined. However, it is usually about 10 nm to about 5 nm, and preferably 50 nm to 1 μm.

The cathode may be transparent or opaque. The transparent cathode can be formed by forming a film of the material of the cathode in a thickness of 1 nm to 10 nm, and further laminating a transparent conductive material such as ITO and IZO thereon.

<<Organic Compound Layer>>

The organic EL element has at least one organic compound layer including an organic light emitting layer. As the layers constituting the organic compound layer other than the organic light emitting layer, there are exemplified a hole transporting layer, an electron transporting layer, a hole blocking layer, an electron blocking layer, a hole injection layer, an electron injection layer, and the like.

In the organic EL element of the present invention, each layer constituting the organic compound layer can be suitably formed by any of a dry film-forming method such as a vapor deposition method, and a sputtering method; a wet-process coating method, a transfer method, a printing method, and an inkjet method.

<<<Organic Light Emitting Layer>>>

The light emitting layer is a layer having functions to receive, at the time of electric field application, holes from the anode, hole injecting layer or hole transporting layer, and to receive electrons from the cathode, electron injection layer or electron transporting layer, and offer the field of recombination of holes and electrons to emit light.

The organic light emitting layer may be composed of luminescent materials alone or may be composed of a mixed layer containing a host material and a luminescent dopant. The luminescent dopant may be a fluorescent luminescent material or a phosphorescent luminescent material, or may be two or more types thereof. The host material is preferably a charge transporting material. The host material may be one or two or more types thereof, and for example, it may be a mixed layer composed of an electron-transporting host material with a hole-transporting host material. The organic light emitting layer may further contain a no-light emitting material having no charge transportability.

The organic light emitting layer may be a single layer or may be composed of two or more layers, and each layer may emit light in different luminescent color.

As for the luminescent dopant, both of a phosphorescent luminescent material and a fluorescent luminescent material can be used as the dopant (phosphorescent luminescent dopant, fluorescent luminescent dopant).

The organic light emitting layer may contain two or more types of luminescent dopants for improving the color purity and for expanding a light-emitting wavelength range. The luminescent dopant is preferably, in reference to a difference in ionization potential ($\Delta Ip$) with respect to the host compound and a difference in electron affinity ($\Delta Ea$) with respect to the host compound, a dopant which further satisfies relationships of 1.2 eV>$\Delta Ip$>0.2 eV, and/or 1.2 eV>$\Delta Ea$>0.2 eV, from the viewpoint of driving durability.

The phosphorescent luminescent dopant is not particularly limited and may be suitably selected in accordance with the intended use. For example, complexes containing a transition metal atom or a lanthanoid atom are exemplified.

The transition metal atom is not particularly limited and may be suitably selected in accordance with the intended use, however, preferred transition metals are ruthenium, rhodium, palladium, tungsten, rhenium, osmium, iridium, gold, silver, copper, and platinum; more preferred are rhenium, iridium, and platinum, with particular preference being given to iridium, and platinum.

The lanthanoid atom is not particularly limited and may be suitably selected in accordance with the intended use. Examples thereof include lanthanum, cerium, praseodymium, neodymium, samarium, europium, gadolinium, terbium, dysprosium, holmium, erbium, thulium, ytterbium, and lutetium. Among these, preferred are neodymium, europium, and gadolinium.

As ligands of the complex, there are exemplified ligands described in "Comprehensive Coordination Chemistry" authored by G. Wilkinson, published by Pergamon Press Ltd. (1987), "Photochemistry and Photophysics of Coordination Compounds" authored by H. Yersin, published by Springer-Verlag Co. in 1987, and "*Yuhki Kinzoku Kagaku—Kiso To Ouyou* (Organic Metal Chemistry—Devices and Applications) authored by Akio Yamamoto, published by Shokabo Publishing Co., Ltd. in 1982.

Specific preferred examples of the ligands include halogen ligands (preferably chlorine ligands); aromatic carbon ring ligands (e.g., cyclopentadienyl anions, benzene anions, or naphthyl anions and the like, these ligands preferably have 5 to 30 carbon atoms, more preferably have 6 to 30 carbon atoms, still more preferably 6 to 20 carbon atoms, particularly preferably have 6 to 12 carbon atoms); nitrogen-containing heterocyclic ligands (e.g., phenylpyridine, benzoquinoline, quinolinol, bipyridyl, phenanthroline and the like, these ligands preferably have 5 to 30 carbon atoms, more preferably have 6 to 30 carbon atoms, still more preferably have 6 to 20 carbon atoms, particularly preferably have 6 to 12 carbon atoms); diketone ligands (e.g., acetylacetone and the like), carboxylic acid ligands (e.g., acetic acid ligands and the like, these ligands preferably have 2 to 30 carbon atoms, more preferably have 2 to 20 carbon atoms, particularly preferably 2 to 16 carbon atoms); alcoholate ligands (e.g., phenolate ligands and the like, these ligands preferably have 1 to 30 carbon atoms, more preferably have 1 to 20 carbon atoms, still more preferably 6 to 20 carbon atoms); silyloxy ligands (e.g., trimethylsilyloxy ligand, dimethyl-tert-butylsilyloxy ligand, triphenylsilyloxy ligand and the like, these ligands preferably have 3 to 40 carbon atoms, more preferably have 3 to 30 carbon atoms, particularly preferably 3 to 20 carbon atoms); carbon monoxide ligands, isonitryl ligands, and cyano ligands, phosphorous ligands (e.g., triphenylphosphine ligand and the like, these ligands preferably have 3 to 40 carbon atoms, more preferably have 3 to 30 carbon atoms, still more preferably have 3 to 20 carbon atoms, particularly preferably 6 to 20 carbon atoms); thiolate ligands (e.g., phenylthiolate ligand and the like, these ligands preferably have 1 to 30 carbon atoms, more preferably have 1 to 20 carbon atoms, still more preferably have 6 to 20 carbon atoms); phosphineoxide ligands (e.g., triphenylphosphine oxide ligand and the like, these ligands preferably have 3 to 30 carbon atoms, more preferably have 8 to 30 carbon atoms, still more preferably have 18 to 30 carbon atoms), with more preference being given to nitrogen-containing heterocyclic ligands.

The complexes may have one transition metal atom in the compound or may have two or more transition metal atoms, that is, may be a so-called dinuclear complex. The complexes may concurrently contain different two or more types of metal atoms.

As the luminescent dopant, there are exemplified phosphorescent luminescent compounds described in U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, WO05/19373A2, Japanese Patent Application Laid-Open (JP-A) Nos. 2001-247859, 2002-302671, 2002-117978, 2003-133074, 2002-235076, 2003-123982, 2002-170684, EP 1211257, Japanese Patent Application Laid-Open (JP-A) Nos. 2002-226495, 2002-234894, 2001-247859, 2001-298470, 2002-173674, 2002-203678, 2002-203679, 2004-357791, 2006-256999, 2007-19462, 2007-84635, and 2007-96259. Among these phosphorescent luminescent compounds, preferred are Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; and more preferred are Ir complexes, Pt complexes, and Re complexes. Of these, still more preferred are Ir complexes, Pt complexes, and Re complexes each having at least one ligand forming a metal-carbon bond, a metal-nitrogen bond, a metal-oxygen bond, or a metal-sulfur bond. Particularly preferred are Ir complexes, Pt complexes, and Re complexes each including tridentate or higher multidentate ligands.

The fluorescent light-emitting dopant is not particularly limited and may be suitably selected in accordance with the intended use. Examples thereof include benzoxazole, benzimidazole, benzothiazole, styrylbenzene, polyphenyl, diphenyl butadiene, tetraphenylbutadiene, naphthalimide, coumarin, pyrane, perinone, oxadiazole, aldazine, pyralizine, cyclopentadiene, bis-styryl anthracene, quinacridone, pyrrolopyridine, thiadiazolopyridine, styryl amine, aromatic dimethylidyne compounds, aromatic condensed polycyclic compounds (anthracene, phenanthroline, pyrene, perylene, rubrene, pentacene, etc.), a variety of metal complexes typified by metal complexes of 8-quinolinol, pyrromethene complexes, and rare-earth complexes; polymer compounds such as polythiophene, polyphenylene, polyphenylene vinylene; organic silane, and derivatives thereof.

Examples of the luminescent dopant include compounds represented by each of the following structural formulas, but are not limited thereto.

D-1
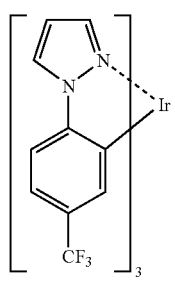

D-2
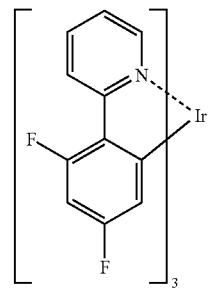

D-3
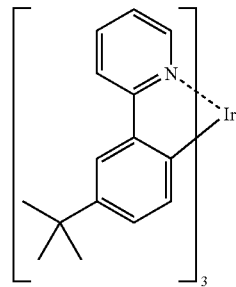

D-4
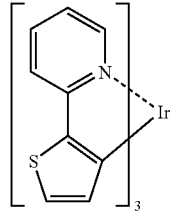

D-5
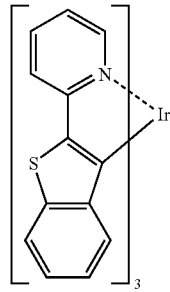

D-6
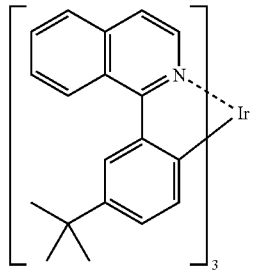

D-7
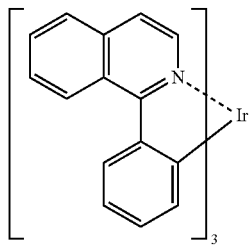

-continued
D-8
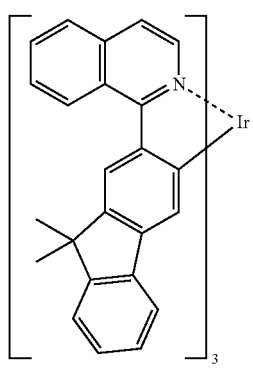
D-9
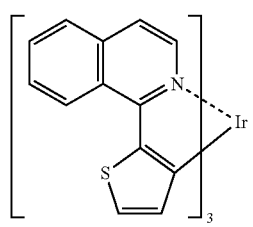
D-10
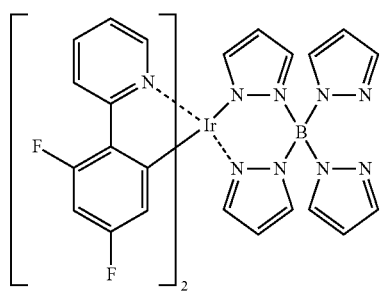
D-11
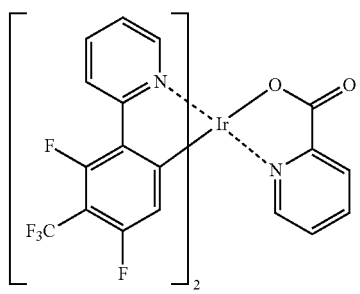
D-12
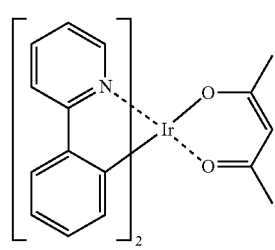
-continued
D-13
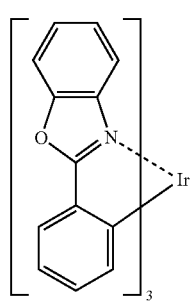
D-14
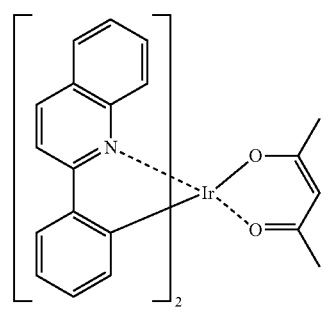
D-15
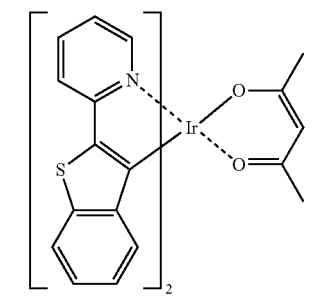
D-16
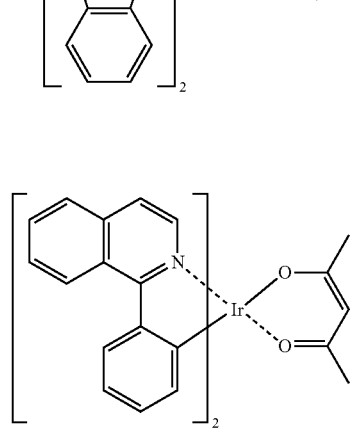
D-17
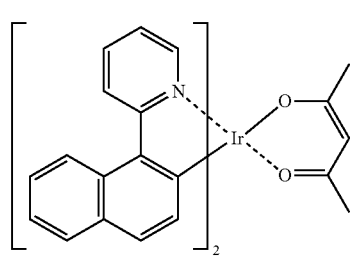

D-18
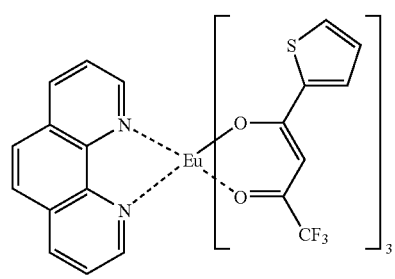
D-19
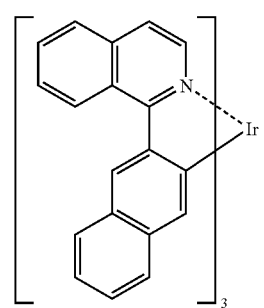
D-20
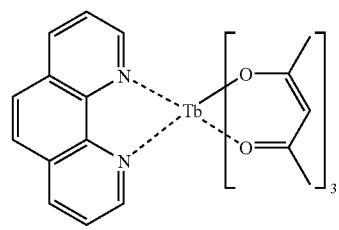
D-21
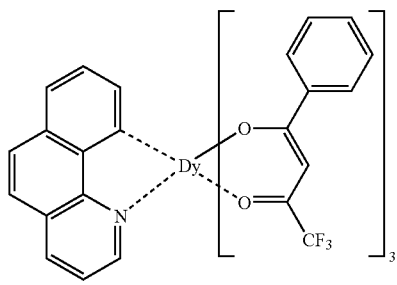
D-22
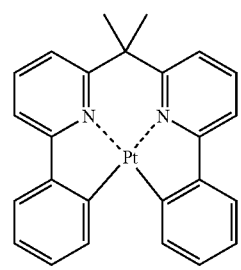
D-23
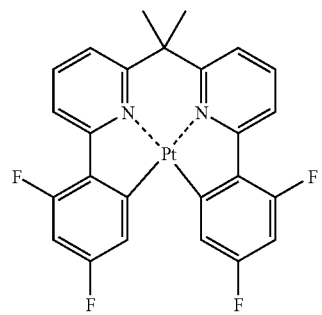
D-24
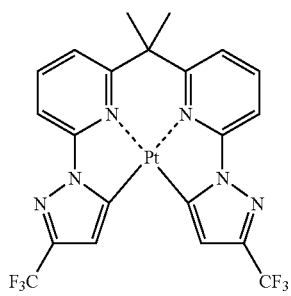
D-25
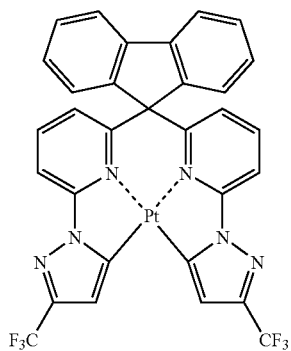
D-26
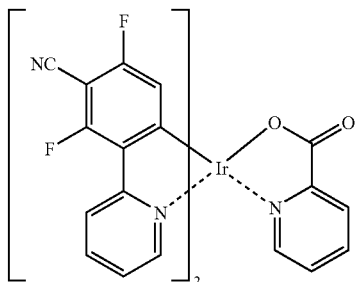
D-27
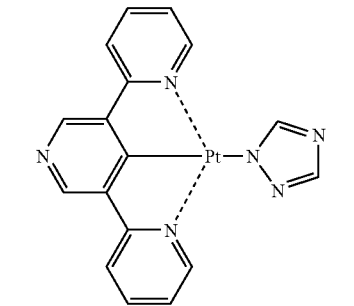

-continued
D-28
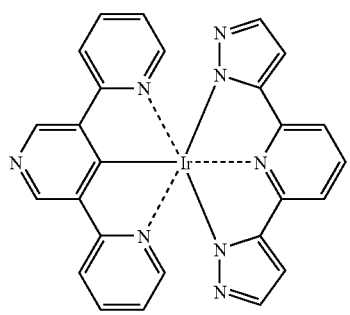
D-29
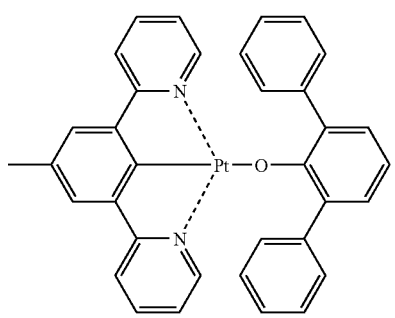
D-30
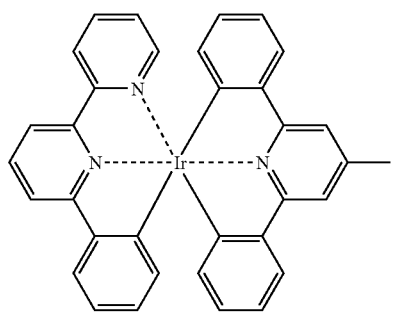
D-31
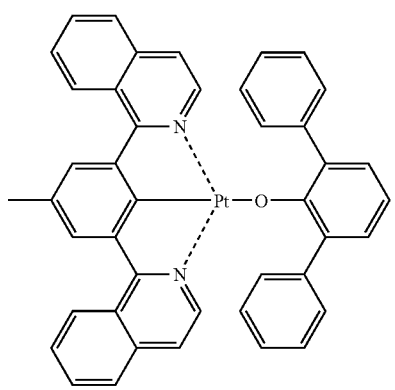
-continued
D-32
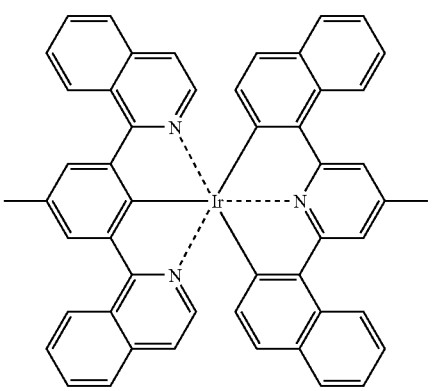
D-33
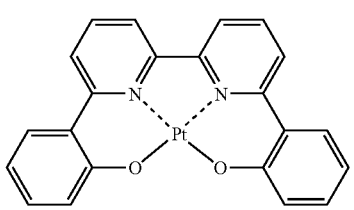
D-34
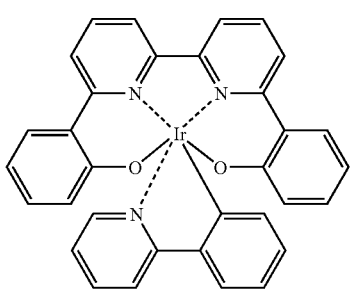
D-35
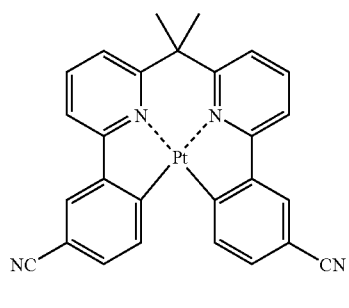
D-36
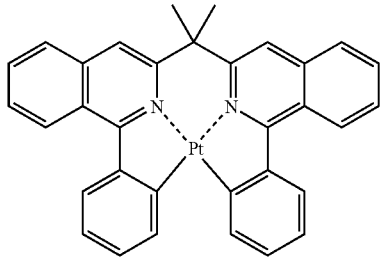

D-37 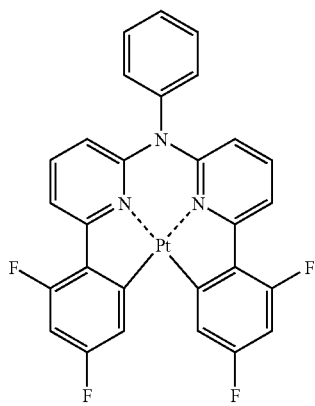

D-38 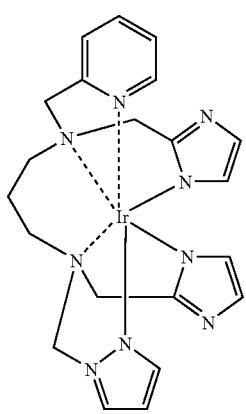

D-39 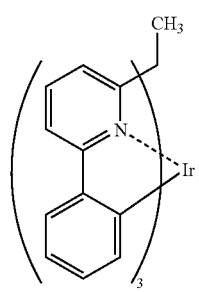

D-40 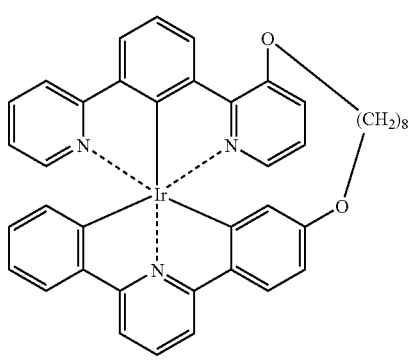

D-41 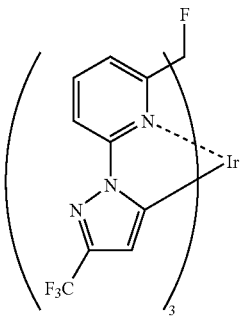

D-42 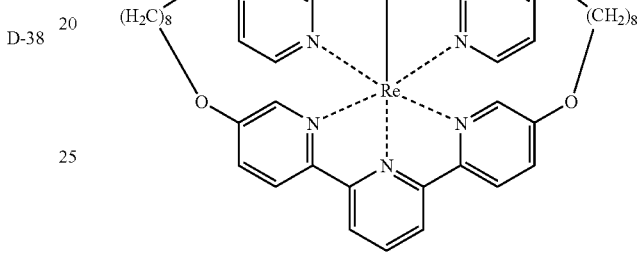

D-43 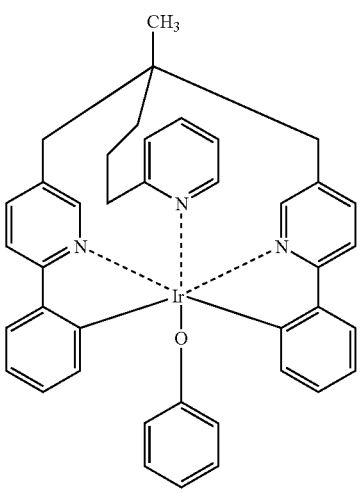

The luminescent dopant in the organic light emitting layer is generally contained in an amount of 0.1% by mass to 50% by mass with respect to the total mass of the compound forming the organic light emitting layer. From the viewpoint of durability and external quantum efficiency, it is however preferably contained in an amount of 1% by mass to 50% by mass, more preferably contained in an amount of 2% by mass to 40% by mass.

The thickness of the organic light emitting layer is not particularly limited, but, generally, it is preferably 2 nm to 500 nm. From the viewpoint of external quantum efficiency, it is more preferably 3 nm to 200 nm, particularly preferably 5 nm to 100 nm.

As the host material, hole-transporting host materials (otherwise, may be referred to as "hole transporting hosts") superior in hole transportability, and electron-transporting host compounds (otherwise, may be referred to as "electron transporting hosts") superior in electron transportability can be used.

Specific examples of the hole transporting hosts in the organic light emitting layer include the following materials: pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electrically conductive high-molecular oligomers such as thiophene oligomers, polythiophenes and the like, organic silanes, carbon films, derivatives thereof.

The hole transporting hosts preferably indole derivatives, carbazole derivatives, aromatic tertiary amine compounds or thiophene derivatives, more preferably compounds having a carbazole group in their molecules, particularly preferably compounds having a t-butyl-substituted carbazole group in their molecules.

The electron transporting hosts in the organic light emitting layer preferably have an electron affinity Ea, from the viewpoint of improvement of durability and reduction in driving electric voltage, of 2.5 eV to 3.5 eV, more preferably 2.6 eV to 3.4 eV, particularly preferably 2.8 eV to 3.3 eV, and preferably have an ionization potential Ip, from the viewpoint of improvement of durability and reduction in driving electric voltage, of 5.7 eV to 7.5 eV, more preferably 5.8 eV to 7.0 eV, particularly preferably 5.9 eV to 6.5 eV.

Specific examples of such electron transporting hosts include pyridine, pyrimidine, triazine, imidazole, pyrazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, heterocyclic tetracarboxylic anhydrides of naphthalene, perylene or the like, phthalocyanine, derivatives thereof (which may form a condensed ring with another ring), and a variety of metal complexes typified by metal complexes of 8-quinolinol derivatives, metal phthalocyanine, and metal complexes having benzoxazole or benzothiazole as the ligand.

Preferred examples of the electron transporting hosts are metal complexes, azole derivatives (benzimidazole derivatives, imidazopyridine derivatives etc.), and azine derivatives (pyridine derivatives, pyrimidine derivatives, triazine derivatives etc.). Among these, more preferred are metal complex compounds, from the viewpoint of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferred is a beryllium ion, an aluminum ion, a gallium ion, a zinc ion, a platinum ion, or a palladium ion; and further preferred is an aluminum ion, a zinc ion, a platinum ion or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Co. in 1987; "YUHKI KINZOKU KAGAKU—KISO TO OUYOU (Organometallic Chemistry—Fundamental and Application—)" authored by Akio Yamamoto, published by Shokabo Publishing Co., Ltd. in 1982; and the like.

As the ligands, preferred are nitrogen-containing heterocyclic ligands (preferably having 1 to 30 carbon atoms, more preferably having 2 to 20 carbon atoms, particularly preferably having 3 to 15 carbon atoms). The ligands may be monodentate ligands or bidentate or higher ligands, but are preferably from bidentate ligands to hexadentate ligands, and mixed ligands of a monodentate ligand with a bidentate to hexadentate ligand are also preferable.

Specific examples of the ligands include azine ligands (e.g. pyridine ligands, bipyridyl ligands, terpyridine ligands, etc.); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands, etc.); alkoxy ligands (e.g. methoxy, ethoxy, butoxy and 2-ethylhexyloxy ligands, and these ligands preferably have 1 to 30 carbon atoms, more preferably have 1 to 20 carbon atoms, particularly preferably have 1 to 10 carbon atoms); aryloxy ligands (e.g. phenyloxy, 1-naphthyloxy, 2-naphthyloxy, 2,4,6-trimethylphenyloxy, and 4-biphenyloxy ligands, and these ligands preferably have 6 to 30 carbon atoms, more preferably have 6 to 20 carbon atoms, particularly preferably have 6 to 12).

In addition to the above, specific examples thereof include heteroaryloxy ligands (e.g. pyridyloxy, pyrazyloxy, pyrimidyloxy, quinolyloxy ligands and the like, and those having preferably 1 to 30 carbon atoms, more preferably 1 to 20 carbon atoms, and particularly preferably 1 to 12 carbon atoms); alkylthio ligands (e.g. methylthio, ethylthio ligands and the like, and those having preferably 1 to 30 carbon atoms, more preferably 1 to 20 carbon atoms, and particularly preferably 1 to 12 carbon atoms); arylthio ligands (e.g. phenylthio ligands and the like, and those having preferably 6 to 30 carbon atoms, more preferably 6 to 20 carbon atoms, and particularly preferably 6 to 12 carbon atoms); heteroarylthio ligands (e.g. pyridylthio, 2-benzimidazolylthio, 2-benzoxazolylthio, 2-benzothiazolylthio ligands and the like, and those having preferably 1 to 30 carbon atoms, more preferably 1 to 20 carbon atoms, and particularly preferably 1 to 12 carbon atoms); siloxy ligands (e.g. a triphenylsiloxy group, a triethoxysiloxy group, a triisopropylsiloxy group and the like, and those having preferably 1 to 30 carbon atoms, more preferably 3 to 25 carbon atoms, and particularly preferably 6 to 20 carbon atoms); aromatic hydrocarbon anion ligands (e.g. a phenyl anion, a naphthyl anion, an anthranyl anion and the like, and those having preferably 6 to 30 carbon atoms, more preferably 6 to 25 carbon atoms, and particularly preferably 6 to 20 carbon atoms); aromatic heterocyclic anion ligands (e.g. a pyrrole anion, a pyrazole anion, a triazole anion, an oxazole anion, a benzoxazole anion, a thiazole anion, a benzothiazole anion, a thiophene anion, a benzothiophene anion and the like, and those having preferably 1 to 30 carbon atoms, more preferably 2 to 25 carbon atoms, and particularly preferably 2 to 20 carbon atoms); and indolenine anion ligands. Among these, nitrogen-containing heterocyclic ligands, aryloxy ligands, heteroaryloxy groups, siloxy ligands are preferable. Nitrogen-containing aromatic heterocyclic ligands, aryloxy ligands, siloxy ligands, aromatic hydrocarbon anion ligands, and aromatic heterocyclic anion ligands are more preferable.

Examples of the metal complex electron transporting hosts include compounds described, for example, in Japanese Patent Application Laid-Open (JP-A) Nos. 2002-235076, 2004-214179, 2004-221062, 2004-221065, 2004-221068, and 2004-327313.

In the organic light emitting layer, the lowest triplet excitation energy (T1) value in the host materials is preferably higher than the T1 value of the phosphorescent luminescent materials, in view of color purity, external quantum efficiency, and driving durability.

The amount of the host compound is not particularly limited, however, it is preferably 15% by mass to 95% by mass with respect to the total mass of the compound forming the light emitting layer, from the viewpoint of the luminescence efficiency and driving voltage.

<<<Hole Injection Layer and Hole Transporting Layer>>>

The hole injection layer and the hole transporting layer are layers functioning to receive holes from an anode or from an anode side and to transport the holes to a cathode side. A hole injection material and a hole transporting material for use in these layers may be low-molecular weight compounds or high-molecular weight compounds.

Specifically, the hole injection layer and the hole transporting layer are preferably layers containing, for example, pyrrole derivatives, carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, phthalocyanine compounds, porphyrin compounds, thiophene compounds, organic silane derivatives, carbon, or the like.

An electron-accepting dopant may be introduced into the hole injection layer or the hole transport layer in the organic EL element of the present invention. As the electron-accepting dopant to be introduced into the hole injection layer or the hole transport layer, either or both of an inorganic compound or an organic compound may be used as long as the compound has electron accepting property and a property for oxidizing the organic compound.

Specific examples of the inorganic compound include metal halides, such as iron (II) chloride, aluminum chloride, gallium chloride, indium chloride and antimony pentachloride, and metal oxides, such as vanadium pentaoxide, and molybdenum trioxide.

In the case of employing an organic compound, a compound having a substituent such as a nitro group, a halogen, a cyano group, a trifluoromethyl group or the like; a quinone compound; an acid anhydride compound; fullerene or the like may be preferably applied.

Besides the above compounds, it is possible to favorably use compounds described in patent documents such as Japanese Patent Application Laid-Open (JP-A) Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, and 2005-209643.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalone, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is more preferable, and tetrafluorotetracyanoquinodimethane is particularly preferable.

These electron-accepting dopants may be used alone or in a combination. Although an applied amount of these electron-accepting dopants depends on the type of material, 0.01% by mass to 50% by mass is preferred with respect to a hole transporting layer material, 0.05% by mass to 20% by mass is more preferable, and 0.1% by mass to 10% by mass is particularly preferred.

The thickness of the hole injection layer and the thickness of the hole transporting layer are each preferably 500 nm or less, from the viewpoint of reducing driving voltage.

The thickness of the hole transporting layer is preferably 1 nm to 500 nm, more preferably 5 nm to 200 nm, still more preferably 10 nm to 100 nm. The thickness of the hole injection layer is preferably 0.1 nm to 200 nm, more preferably 0.5 nm to 100 nm, still more preferably 1 nm to 100 nm.

The hole injection layer and the hole transporting layer may take a single-layer structure containing one or two or more of the above-mentioned materials, or a multilayer structure composed of plural layers of a homogeneous composition or a heterogeneous composition.

<<<Electron Injection Layer and Electron Transporting Layer>>>

The electron injection layer and the electron transporting layer are layers having functions for receiving electrons from a cathode or from a cathode side, and transporting electrons to an anode side. An electron injection material and an electron transporting material for use in these layers may be low-molecular weight compounds or high-molecular weight compounds.

Specifically, the hole injection layer and the hole transporting layer are preferably layers containing, for example, pyridine derivatives, quinoline derivatives, pyrimidine derivatives, pyrazine derivatives, phthalazine derivatives, phenanthroline derivatives, triazine derivatives, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, aromatic cyclic tetracarboxylic anhydrides of perylene, naphthalene or the like, phthalocyanine derivatives, metal complexes typified by metal complexes of 8-quinolinol derivatives, metal phthalocyanine, and metal complexes containing benzoxazole, or benzothiazole as the ligand, organic silane derivatives typified by silole, and the like.

The electron injection layer or the electron transporting layer in the organic EL element of the present invention may contain an electron donating dopant. As the electron donating dopant introduced in the electron injection layer or the electron transporting layer, any material may be used as long as it has an electron-donating property and a property for reducing the organic compound, and alkaline metals such as Li, alkaline earth metals such as Mg, transition metals including rare-earth metals, and a reducible organic compound are preferably used. As the materials, particularly, metals having a work function of 4.2 eV or less are preferably used, and specific examples thereof include Li, Na, K, Be, Mg, Ca, Sr, Ba, Y, Cs, La, Sm, Gd, Yb, and the like. Specific examples of the reducible organic compound include nitrogen-containing compounds, sulfur-containing compounds, phosphorus-containing compounds, and the like.

Besides the above materials, it is possible to use materials described in Japanese Patent Application Laid-Open (JP-A) Nos. 6-212153, 2000-196140, 2003-68468, 2003-229278, 2004-342614, and the like.

These electron donating dopants may be used alone or in combination. An applied amount of the electron donating dopants differs dependent on the types of the materials, but it is preferably from 0.1% by mass to 99% by mass with respect to an electron transporting layer material, more preferably from 1.0% by mass to 80% by mass, and particularly preferably from 2.0% by mass to 70% by mass.

The thickness of the electron injection layer and the thickness of the electron transporting layer are each preferably 500 nm or less from the viewpoint of reducing driving voltage.

The thickness of the electron transporting layer is preferably from 1 nm to 500 nm, more preferably from 5 nm to 200 nm, particularly preferably 10 nm to 100 nm. The thickness of the electron injection layer is preferably from 0.1 nm to 200 nm, more preferably from 0.2 nm to 100 nm, particularly preferably from 0.5 nm to 50 nm.

The electron injection layer and the electron transporting layer may take a single layer structure containing one or two or more of the above-mentioned materials, or a multilayer structure composed of plural layers of a homogeneous composition or a heterogeneous composition.

<<<Hole Blocking Layer>>>

The hole blocking layer is a layer having a function to prevent holes transported from the anode side to the light emitting layer from passing through the cathode side. The hole blocking layer can be provided as an organic compound layer contiguous to the light emitting layer on the cathode side.

As a compound constituting the hole blocking layer, for example, aluminum complexes such as BAlq, triazole derivatives, and phenanthroline derivatives such as BCP are exemplified.

The thickness of the hole blocking layer is preferably 1 nm to 500 nm, more preferably 5 nm to 200 nm, particularly preferably 10 nm to 100 nm.

The electron blocking layer may take a single-layer structure containing one or 15 two or more of the above-mentioned materials, or a multilayer structure composed of plural layers of a homogeneous composition or a heterogeneous composition.

<<<Electron Blocking Layer>>>

The electron blocking layer is a layer having a function to prevent electrons transported from the cathode side to the light emitting layer from passing through the anode side. In the present invention, the electron blocking layer can be provided as an organic compound layer contiguous to the light emitting layer on the anode side.

As a compound constituting the electron blocking layer, for example, those exemplified as hole transporting materials above can be used.

The thickness of the electron blocking layer is preferably 1 nm to 500 nm, more preferably 5 nm to 200 nm, particularly preferably 10 nm to 100 nm.

The hole blocking layer may take a single-layer structure containing one or two or more of the above-mentioned materials, or a multilayer structure composed of plural layers of a homogeneous composition or a heterogeneous composition.

<<Protective Layer>>

The entirety of the organic EL element may be protected by a protective layer.

Materials to be contained in the protective layer are sufficient to have a function to prevent substances accelerating deterioration of the device, such as moisture and oxygen, from entering into the device.

Specific examples of such materials include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$, and $SiN_xO_y$; metal fluorides such as $MgF_2$, LiF, $AlF_3$, and $CaF_2$; copolymers of dichloroethylene with polyethylene, polypropylene, polymethylmethacrylate, polyimide, polyurea, polytetrafluoroethylene, polychlorotrifluoroethylene, polychlorotrifluoroethylene, polydichlorodifluoroethylene, and/or chlorotrifluoroethylene; a copolymer obtained by copolymerization of tetrafluoroethylene with a monomer mixture containing at least one co-monomer, a fluorine-containing copolymer having a cyclic structure at its copolymer main chain, hydrophilic substances having a coefficient of water absorption of 1% or higher, and water-vaporproof substances having a coefficient of water absorption of 0.1% or lower.

A method of forming the protective layer is not particularly limited and may be suitably selected in accordance with the intended use. For example, there are exemplified a vacuum deposition method, sputtering method, reactive sputtering method, MBE (Molecular Beam epitaxy) method, cluster ion beam method, ion plating method, plasma polymerization method (high-frequency excited ion[plating method], plasma CVD method, laser CVD method, thermal CVD method, gas-source CVD method, coating method, printing method, and transfer method.

<<Sealing>>

Furthermore, the organic EL element may be entirely sealed with a sealing container.

Additionally, a moisture absorbent or an inactive liquid may be encapsulated in a space between the sealing container and the light emitting element. The moisture absorber is not particularly limited and may be suitably selected in accordance with the intended use. Examples thereof include barium oxides, sodium oxides, potassium oxides, calcium oxides, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieves, zeolite, and magnesium oxide. The inactive liquid is not particularly limited and may be suitably selected in accordance with the intended use. Examples thereof include paraffins, fluid paraffins, fluorine solvents such as perfluoroalkane, perfluoroamine, and perfluoroether; chlorine solvents, and silicone oils.

In addition, the sealing method employed in a resin sealing layer described below is also preferably used.

<<<Resin Sealing Layer>>>

The organic EL element preferably has functions to prevent the organic EL element-self from being brought into contact with atmosphere and to suppress degradation of the element performance due to oxygen and moisture.

Resin materials for use in the resin sealing layer is not particularly limited and may be suitably selected in accordance with the intended use. Examples thereof include acrylic resins, epoxy resins, fluororesins, silicon resins, rubber resins, and ester resins. Among these resin materials, preferred are epoxy resins in terms of moisture-preventive capability. Among the epoxy resins, thermocurable epoxy resins, and photocurable epoxy resins are more preferred.

A method for producing the resin sealing layer is not particularly limited and may be suitably selected in accordance with the intended use. For example, there are exemplified a method of applying a resin solution, a method of contact bonding or thermally contact bonding a resin sheet, a method of dry polymerization through deposition, sputtering, or the like.

The thickness of the resin sealing layer is preferably 1 µm to 1 mm, more preferably 5 µm to 100 µm, particularly preferably 10 µm to 50 µm. When the thickness is less than 1 there is a possibility that the inorganic film is impaired when a second substrate is attached thereon. When the thickness is more than 1 mm, the thickness of the electroluminescence element itself is thicker, possibly degrading thin-film property of the organic EL element, which is a characteristic thereof.

<<<Sealing Adhesive>>>

A sealing adhesive for use in the sealing has a function to prevent moisture and oxygen from entering into the organic EL element from its distal ends thereof.

As materials for the sealing adhesive, the same materials for the resin sealing layer can be used. Among the materials, in view of prevention of moisture, preferred is an epoxy adhesive, and more preferred are a photocurable adhesive and a thermocurable adhesive.

Further, it is preferred to add a filler to the above-mentioned materials.

As a filler to be added to the sealing agent, inorganic materials such as $SiO_2$, SiO (silicon oxide), SiON (silicon oxynitride), SiN (silicone nitride) and the like are preferred. By adding a filler to the sealing agent, the viscosity of the sealing agent is increased, leading to improvements in process suitability and humidity resistance.

The sealing adhesive may contain a desiccating agent. As the desiccating agent, barium oxides, calcium oxides, strontium oxides are preferred.

An amount of the desiccating agent added to the sealing agent is preferably 0.01% by mass to 20% by mass, more preferably 0.05% by mass to 15% by mass. When the addition amount is less than 0.01% by mass, the effect of adding the desiccating agent is reduced. When it is more than 20% by mass, it is undesirably difficult to homogenously disperse the desiccating agent in the sealing adhesive.

[Formulation of Sealing Adhesive]

Composition and Concentration of Polymer

The sealing adhesive is not particularly limited and the one described above can be used. For example, as a photocurable epoxy-based adhesive, XNR5516 produced by Nagase Chemtech Co. is exemplified. This sealing adhesive is directly added to and dispersed in the desiccating agent.

Thickness

The coating thickness of the sealing adhesive is preferably from 1 µm to 1 mm. When the coating thickness is less than 1 µm, unfavorably, the sealing adhesive cannot be uniformly applied. When it is more than 1 mm, unfavorably, a leak path that allows moisture to enter the interior of the organic EL element widens.

The sealing adhesive containing the desiccating agent is applied in an arbitrary amount to a surface of a substrate by a dispenser or the like, and a second substrate is superposed on the coated substrate, followed by curing, and thus a functional element can be obtained.

<<Driving>>

By the application of DC (if necessary, AC component may be contained) voltage (generally from 2 volts to 15 volts) between the anode and the cathode, or by the application of DC electric current, light emission of the organic electroluminescence element of the invention can be obtained.

As to the driving method of the organic EL element, the driving methods disclosed in Japanese Patent Application Laid-Open (JP-A) Nos. 2-148687, 6-301355, 5-29080, 7-134558, 8-234685, 8-241047, Japanese Patent (JP-B) No. 2784615, U.S. Pat. Nos. 5,828,429, and 6,023,308 can be applied to the present invention.

The organic EL element of the invention may be what is called top emission system of collecting light from the anode side.

The organic EL element of the invention can take a structure in which a charge generating layer is provided between a plurality of light emitting layers for improving luminous efficiency.

The charge generating layer has functions of generating charge (holes and electrons) at the time of application of electric field and injecting the generated charge to the layer contiguous to the charge-generating layer.

As the material for forming the charge generating layer, any material can be used so long as it has the above functions, and the charge generating layer may contain a single compound or a plurality of compounds.

Specifically, the material may be a material having conductivity, may be a material having semi-conductivity such as a doped organic layer, or may be a material having an electric insulating property, and examples of the materials include disclosed in Japanese Patent Application Laid-Open (JP-A) Nos. 11-329748, 2003-272860, and 2004-39617.

More specifically, transparent conductive materials such as ITO and IZO (indium zinc oxide), Fullerenes such as C60, conductive organic materials such as oligothiophene, conductive organic materials such as metallic phthalocyanines, metal-free phthalocyanines, metallic porphyrins, and metal-free porphyrins, metallic materials such as Ca, Ag, Al, Mg:Ag alloy, Al:Li alloy, and Mg:Li alloy, hole-conductive materials, electron-conductive materials, and mixtures of these materials may be used.

As the hole-conductive materials, for example, materials obtained by doping oxidants having an electron-withdrawing property such as F4-TCNQ, TCNQ, $FeCl_3$ to hole-transporting organic materials such as 2-TNATA and NPD, P-type conductive polymers, and P-type semiconductors are exemplified. As the electron-conductive materials, for example, materials obtained by doping metals or metallic compounds having a work function of less than 4.0 eV to electron-transporting organic materials, N-type conductive polymers, and N-type semiconductors are exemplified. As the N-type semiconductors, N-type Si, N-type CdS, and N-type ZnS are exemplified, and the P-type semiconductors, P-type Si, P-type CdTe, and P-type CuO are exemplified.

Further, an electrically insulating material such as $V_2O_5$ can also be used as the charge-generating layer.

The charge generating layer may be a single layer, or a laminate of a plurality of layers. As the structure of lamination of a plurality of layers, a layer having a structure of the lamination of a material having conductivity such as a transparent conductive material or a metallic material and a hole-conductive material or an electron-conductive material, and a layer having a structure of the lamination of the hole-conductive material and the electron-conductive material are exemplified.

Generally, it is preferred to select the film thickness and materials of the charge generating layer so that a visible light transmittance is 50% or higher. The film thickness is not particularly limited and may be suitably selected in accordance with the intended use. It is preferably 0.5 nm to 200 nm, more preferably 1 nm 100 nm, still more preferably 3 nm to 50 nm, particularly preferably 5 nm to 30 nm.

The forming method of the charge generating layer is not particularly limited, and the forming method of the organic compound layer can be used.

The charge generating layer is formed between each two layers of a plurality of light emitting layers, and the anode side and the cathode side of the charge generating layer may contain materials having a function of injecting charge to the contiguous layers. For heightening an electron injecting property to the layer contiguous to the anode side, electron injecting compounds such as BaO, SrO, $Li_2O$, LiCl, LiF, $MgF_2$, MgO, $CaF_2$ may be laminated on the anode side of the charge generating layer.

Besides the above description, the materials of the charge generating layer can be selected with reference to Japanese Patent Application Laid-Open (JP-A) No. 2003-45676, U.S. Pat. Nos. 6,337,492, 6,107,734, and 6872472.

The organic EL element may have a resonator structure. For example, the organic EL element has a multilayer film mirror including a plurality of laminated films different in refractive index, a transparent or translucent electrode, a light emitting layer, and a metal electrode by superposition on a transparent substrate. The light generated from the light emitting layer repeats reflection and resonates between the multilayer film mirror and the metal electrode as reflectors.

As another preferred embodiment, a transparent or translucent electrode and a metal electrode respectively function as reflectors on a transparent substrate, and light generated from the light emitting layer repeats reflection and resonates between them.

To form a resonance structure, effective refractive indices of two reflectors, optical path determined by the refractive index and thickness of each layer between the reflectors are adjusted to be optimal values to obtain a desired resonance wavelength. The expression of the case of the first embodiment is disclosed in Japanese Patent Application Laid-Open (JP-A) No. 9-180883. The expression of the case of the second embodiment is disclosed in Japanese Patent Application Laid-Open (JP-A) No. 2004-127795.

<Fine Particle Containing Layer>

The fine particle containing layer is disposed on an optical path of light emitted from the light emitting layer and contains at least an organic resin material, a first fine particle and a second fine particle, and further contains other components as required.

The thickness of the fine particle containing layer is not particularly limited and may be suitably selected in accordance with the intended use. It is, however, preferably less than 5 μm.

When the thickness of the fine particle containing layer is 5 μm or more, the light use efficiency may degrade and image bleeding may take place during the time where light emitting part is partitioned on a pixel to pixel basis.

<<Organic Resin Material>>

The organic resin material is not particularly limited and may be suitably selected in accordance with the intended use. Examples thereof include imide resins, acrylic resins, ether resins, and silane resins.

<<First Fine Particle>>

The first fine particle is not particularly limited and may be suitably selected in accordance with the intended use. Examples thereof include inorganic fine particles such as zinc oxide (refractive index: 1.9 to 2.0), alumina (refractive index: about 1.7), titanium oxide ($TiO_2$) (refractive index: about 2.6), and zirconia ($ZrO_2$) (refractive index: about 2.3), and organic fine particles such as melamine (refractive index: about 1.6), and benzoguanamine (refractive index: about 1.65). Among these, zinc oxide, titanium oxide ($TiO_2$), and zirconia ($ZrO_2$) are preferred in terms of high refractive index and capability of expecting effects with a small use amount.

The weight average particle diameter of the first fine particle is not particularly limited. It is, however, preferably smaller than 50 nm. When the weight average particle diameter of the first fine particle is 50 nm or more, a refractive index $n_1$ of the organic resin material into which the first fine particle is added may not be adjusted so as to be sufficiently close to a refractive index $n_2$ of the light emitting layer in the organic EL element. Note that the weight average particle diameter of the first fine particle is measured and calculated by observation through a transmission electron microscope.

The first fine particle is preferably dispersed as primary particle (monodispersed) in the fine particle containing layer. By allowing the first fine particle to be dispersed as primary particle in the fine particle containing layer, it is possible to further improve the efficiency of extraction of light.

The method of dispersing the first fine particle as primary particle in the fine particle containing layer is not particularly limited, and may be suitably selected in accordance with the intended use. For example, there are exemplified irradiation of an ultrasonic wave to a particle containing solution, surface treatment of fine particle using organic matter such as a silane coupling agent, addition of the after-mentioned fine particle dispersant, and physical pulverization after mixing a dispersant and particles.

Whether or not the first fine particle is dispersed as primary particle can be checked based on a particle size distribution thereof measured by a particle size distribution meter. When a measured particle size distribution has only one peak, it means that the first fine particle is dispersed as primary particle. When a measured particle size distribution has two or more peaks, it means that the first fine particle is dispersed as secondary particle.

<<Second Fine Particle>>

The second fine particle is not particularly limited and may be suitably selected in accordance with the intended use. Examples thereof include inorganic fine particles such as zinc oxide (refractive index: 1.9 to 2.0), alumina (refractive index: about 1.7), titanium oxide ($TiO_2$) (refractive index: about 2.6), and zirconia ($ZrO_2$) (refractive index: about 2.3), and organic fine particles such as melamine (refractive index: about 1.6), and benzoguanamine (refractive index: about 1.65). Among these, zinc oxide (refractive index: 1.9 to 2.0), titanium oxide ($TiO_2$) (refractive index: about 2.6), and zirconia ($ZrO_2$) (refractive index: about 2.3) are preferred in terms of high refractive index.

The weight average particle size of the second fine particle is not particularly limited and may be suitably selected in accordance with the intended use. It is, however, preferably, 50 nm to 5 μm. When the weight average particle size of the second fine particle is smaller than 50 nm, the light scattering effect may not be given to the fine particle containing layer. When it is greater than 5 μm, the light use efficiency may decrease and image bleeding may take place during the time where light emitting part is partitioned on a pixel to pixel basis. Note that the weight average particle diameter of the second fine particle is measured and calculated by observation through a transmission electron microscope.

The second fine particle is preferably dispersed as primary particle (monodispersed) in the fine particle containing layer. By allowing the second fine particle to be dispersed as primary particle in the fine particle containing layer, it is possible to further improve the efficiency of extraction of light.

The method of dispersing the second fine particle as primary particle in the fine particle containing layer is not particularly limited, and may be suitably selected in accordance with the intended use. For example, there are exemplified irradiation of an ultrasonic wave to a particle containing solution, surface treatment of fine particle using organic matter such as a silane coupling agent, addition of the after-mentioned fine particle dispersant, and physical pulverization after mixing a dispersant and particles. Whether or not the second fine particle is dispersed as primary particle can be checked based on a particle size distribution thereof measured by a particle size distribution meter. When a measured particle size distribution has only one peak, it means that the second fine particle is dispersed as primary particle. When a measured particle size distribution has two or more peaks, it means that the second fine particle is dispersed as secondary particle.

<<Relationship of Refractive Indices>>

The relationship between a refractive index $n_1$ of the organic resin material into which the first fine particle is added, and an average refractive index $n_2$ of the organic compound layer is not particularly limited, as long as a relationship $|n_1-n_2|<0.25$ is satisfied, and may be suitably selected in accordance with the intended use.

In the case of a conventional organic EL element having no light-extraction structure, the average refractive index of an organic compound layer including a light emitting layer is about 1.8, and when a direction of light emission front face inside the light emitting layer of EL is set to zero degrees, optical components only up to an incident angle of 30° cannot be extracted due to influence of total reflection.

The average refractive index $n_2$ of the organic compound layer is represented by the equation, $n_2=(n_{X1} \times t_{X1} + n_{X2} \times t_{X2} + \ldots + n_{Xn} \times t_{Xn})/(t_{X1}+t_{X2}+ \ldots +t_{Xn})$. In the equation, refractive indices of individual layers constituting the organic compound layer are represented by $n_{x1}, n_{x2}, \ldots n_{xn}$, and layer thicknesses of these layers are represented by $t_{x1}, t_{x2}, \ldots t_{xn}$.

The refractive indices of individual layers constituting the organic compound layer $n_{x1}, n_{x2}, \ldots n_{xn}$ can be obtained by measuring a refractive index, after being film-formed on a predetermined substrate, using an elipsometer.

By satisfying the relationship $|n_1-n_2|<0.25$, the refractive index $n_1$ of the organic resin material into which the first fine particle is added can be adjusted so as to be sufficiently close to the average refractive index $n_2$ of the light emitting layer in the organic EL element, whereby light emitted from the light emitting layer can be made repetitively reflected in the fine particle containing layer.

<<Measurement Method of Refractive Index $n_1$ of Organic Resin Material into which First Fine Particle is Added>>

The refractive index $n_1$ of the organic resin material into which the first fine particle is added can be obtained by measuring a refractive index of the organic resin material into which the first fine particle is added, after being film-formed on a predetermined substrate, using an elipsometer.

The relationship between the refractive index $n_1$ of the organic resin material into which the first fine particle is added, and a refractive index $n_3$ of the second fine particle is not particularly limited, as long as a relationship $n_3-n_1>0.2$ is satisfied, and may be suitably selected in accordance with the intended use.

By satisfying the relationship $n_3-n_1>0.2$, the refractive index $n_3$ of the second fine particle can be made sufficiently high, and the light scattering effect can be sufficiently given to the fine particle containing layer.

<<Other Components>>

The other components are not particularly limited, and may be suitably selected in accordance with the intended use. Examples thereof include fine particle dispersants. The fine particle dispersant is added so that the fine particles are dispersed as primary particles in the fine particle containing layer.

(Dispersant)

In the dispersion of the first and second fine particles of the present invention, it is preferred to use a dispersant having an anionic group. The anionic group is not particularly limited and may be suitably selected in accordance with the intended use. Examples thereof include groups having an acidic proton such as a carboxyl group, sulfonic acid group (sulfo group), phosphoric acid group (phosphono group), and sulfone amide group or salts thereof. Among these, carboxyl group, sulfonic acid group, phosphoric acid group or salts thereof are preferred, and carboxyl group and phosphoric acid group are particularly preferred.

The number of anionic groups contained per molecule of the dispersant is not particularly limited, as long as one or more anionic groups are contained therein, and may be suitably selected in accordance with the intended use. For the purpose of improving the dispersibility of the fine particles, a plural number of anionic groups may be contained per molecule of the dispersant. The number of anionic groups contained per molecule is preferably two or more, more preferably five or more, particularly preferably 10 or more. Also, two or more types of anionic groups may be contained per molecule of the dispersant.

Specific examples of the dispersant having an anionic polar group include "PHOSPHANOL" {PE-510, PE-610, LB-400, EC-6103, RE-410 etc.; produced by Toho Chemical Industry Co., Ltd., "DISPERBYK" (-110, -111, -116, -140, -161, -162, -163, -164, -170, -171 etc.; produced by BykChemie Japan).

Preferably, the dispersant further contain a crosslinkable or polymerizable functional group. Examples of the crosslinkable or polymerizable functional group include ethylenically unsaturated groups capable crosslinking reaction/polymerization reaction by radical seeds {e.g. (meth)acryloyl group, aryl group, styryl group, vinyloxy group, etc.}, cationically polymerizable groups (epoxy group, oxetanyl group, vinyloxy group, etc.), and polycondensation reactive groups (hydrolyzable silyl group, N-methylol group, etc.). Preferred are functional groups having an ethylenically unsaturated group.

The dispersant for use in dispersion of the first and second fine particles in the present invention is preferably a dispersant having an anionic group and a crosslinkable or polymerizable functional group and having the crosslinkable or polymerizable functional group on the side chains.

In the present invention, a mass average molecular weight (Mw) of the dispersant is not particularly limited and may be suitably selected in accordance with the intended use, however, preferably 1,000 or more. A more preferred mass average molecular weight (Mw) of the dispersant is from 2,000 to 1,000,000, more preferably 5,000 to 200,000, particularly preferably 10,000 to 100,000.

Specific compounds of a dispersant that can be particularly preferably used in the present invention are described in paragraphs [0047] to [0063] in Japanese Patent Application Laid-Open (JP-A) No. 2004-29705. Two or more types of dispersants may be used in combination.

An applied amount of the dispersant to the fine particles is preferably in the range of from 1% by mass to 50% by mass, more preferably from 5% by mass to 30% by mass, most preferably from 5% by mass to 20% by mass. As the dispersant, two or more types of dispersants may be used in combination.

<Other Members>

The other members are not particularly limited and may be suitably selected in accordance with the intended use. For example, substrates are exemplified.

<<Substrate>>

The substrate is not particularly limited and may be suitably selected in accordance with the intended use. It is however preferably a substrate that does not scatter or attenuate the light emitted from the organic compound layer. Specific examples of materials of the substrate include inorganic materials, e.g., yttria stabilized zirconia (YSZ), glass, etc., and organic materials, such as polyester, e.g., polyethylene terephthalate, polybutylene phthalate, polyethylene naphthalate, etc., polystyrene, polycarbonate, polyether sulfone, polyallylate, polyimide, polycycloolefin, norbornene resin, poly(chlorotrifluoroethylene), etc.

For instance, when glass is used as the substrate, alkali-free glass is preferably used as the material for reducing elution of ions from the glass. Further, when soda lime glass is used, it is preferred to provide a barrier coat such as silica. In the case of organic materials, materials excellent in heat resistance, dimensional stability, solvent resistance, electrical insulating properties and processability are preferably used.

The shape, structure and size of the substrate are not especially restricted, and these can be arbitrarily selected in accordance with the intended use and purpose of the light emitting element. In general, the substrate is preferably plate-shaped. The structure of the substrate may be a single layer structure or may be a lamination structure, and may consist of a single member or may be formed of two or more members.

The substrate may be colorless and transparent, or may be colored and transparent, but from the viewpoint of not scattering or attenuating the light emitted from the organic light emitting layer, a colorless and transparent substrate is preferably used.

The substrate can be provided with a moisture permeation preventing layer (a gas barrier layer) on the front surface or rear surface.

As the materials of the moisture permeation-preventing layer (the gas barrier layer), inorganic materials such as silicon nitride and silicon oxide are preferably used. The moisture permeation-preventing layer (the gas barrier layer) can be formed, for example, by a high frequency sputtering method.

When a thermoplastic substrate is used, if necessary, a hard coat layer and an undercoat layer may further be provided.

At the time of forming a TFT on the substrate, a passivation layer may be provided as a base of the TFT.

<First Embodiment of Organic Electroluminescence Display Device>

A first embodiment of the organic electroluminescence display device is, for instance, as illustrated in FIG. 1, a bottom emission type organic electroluminescence display device which includes a transparent substrate 1 such as a glass substrate, a fine particle containing layer 2 which is provided on the transparent substrate 1 and contains an organic resin material, a first fine particle 2a, and a second fine particle 2b having a weight average particle diameter greater than that of the first fine particle 2a, a transparent electrode (anode) 3 which is provided on the fine particle containing layer 2 and composed of ITO or the like, an organic compound layer 4 which is provided on the transparent electrode (anode) 3 and includes a light emitting layer and the like, and a reflective electrode (cathode) 5 which is provided on the organic compound layer 4 and composed of silver, aluminum or the like.

According to the first embodiment of the present invention, the first fine particle 2a in the fine particle containing layer 2 contributes to an increase in refractive index of the fine particle containing layer 2, and the second fine particle 2b in the fine particle containing layer 2 contributes to the scattering of light emitted from the light emitting layer in the organic compound layer 4 and passing through the fine particle containing layer 2, and therefore it is possible to enhance the light extraction efficiency.

<Second Embodiment of Organic Electroluminescence Display Device>

Figure 2:
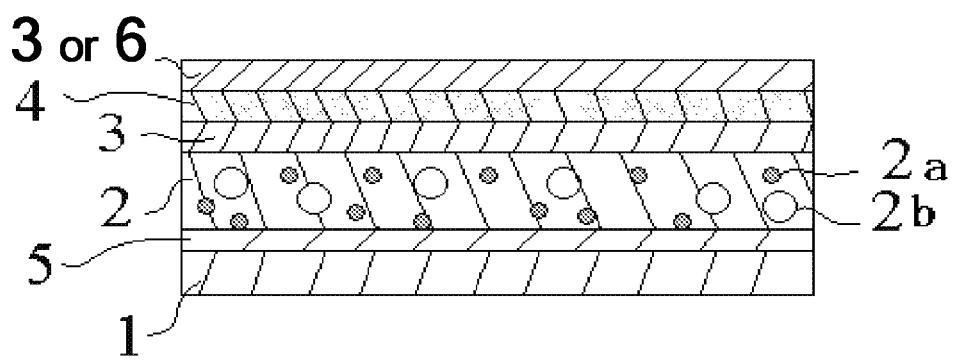
FIG. 2 is a view illustrating another example of a configuration of an organic electroluminescence display device according to the present invention.

A second embodiment of the organic electroluminescence display device is, for instance, as illustrated in FIG. 2, a top emission type organic electroluminescence display device which includes a transparent substrate 1 such as a glass substrate, a reflective electrode (cathode) 5 which is provided on the transparent substrate 1 and composed of silver, aluminum or the like, a fine particle containing layer 2 which is provided on the reflective electrode (cathode) 5 and contains an organic resin material, a first fine particle 2a, and a second fine particle 2b having a weight average particle diameter greater than that of the first fine particle 2a, a transparent electrode (anode) 3 which is provided on the fine particle containing layer 2 and composed of ITO or the like, an organic compound layer 4 which is provided on the transparent electrode (anode) 3 and includes a light emitting layer and the like, and a transparent electrode 3 which is provided on the organic compound layer 4 and composed of ITO or the like (or, a translucent electrode 6 composed of Ag, Al, etc.).

According to the second embodiment of the present invention, the first fine particle 2a in the fine particle containing layer 2 contributes to an increase in refractive index of the fine particle containing layer 2, and the second fine particle 2b in the fine particle containing layer 2 contributes to the scattering of light emitted from the light emitting layer in the organic compound layer 4 and passing through the fine particle containing layer 2, and therefore it is possible to enhance the light extraction efficiency.

<Third Embodiment of Organic Electroluminescence Display Device>

Figure 3:
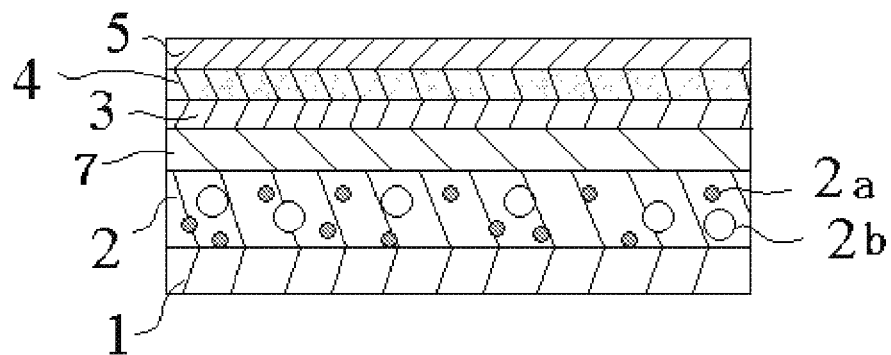
FIG. 3 is a view illustrating still another example of a configuration of an organic electroluminescence display device according to the present invention.

A third embodiment of the organic electroluminescence display device is, for instance, as illustrated in FIG. 3, a bottom emission type organic electroluminescence display device which includes a transparent substrate 1 such as a glass substrate, a fine particle containing layer 2 which is provided on the transparent substrate 1 and contains an organic resin material, a first fine particle 2a, and a second fine particle 2b having a weight average particle diameter greater than that of the first fine particle 2a, a flattening film 7 which is provided on the fine particle containing layer 2, and contains an acrylic resin, a resin layer containing particles inside thereof, an inorganic film such as ZnO, TiO$_2$, etc., a transparent electrode (anode) 3 which is provided on the flattening layer 7 and composed of ITO or the like, an organic compound layer 4 which is provided on the transparent electrode (anode) 3 and includes a light emitting layer and the like, and a reflective electrode (cathode) 5 which is provided on the organic compound layer 4 and composed of silver, aluminum or the like.

According to the third embodiment of the present invention, the first fine particle 2a in the fine particle containing layer 2 contributes to an increase in refractive index of the fine particle containing layer 2, and the second fine particle 2b in the fine particle containing layer 2 contributes to the scattering of light emitted from the light emitting layer in the organic compound layer 4 and passing through the fine particle containing layer 2, and therefore it is possible to enhance the light extraction efficiency.

As a method of making the organic EL display device full colors, for example, as described in Monthly Display, pp. 33-37 (September, 2000), a three-color light-emitting method of arranging organic EL elements emitting lights corresponding to three primary colors (blue (B), green (G) and red (R)) of colors on a substrate, a white color method of separating white color emission by an organic EL element for white color emission to three colors through a color filter, and a color-converting method of converting blue color emission by an organic EL element for blue color emission to red (R) and green (G) through a fluorescent dye layer are known.

Further, by using in combination of a plurality of organic EL elements different in luminescent colors capable of obtaining by the above method, plane light sources of desired luminescent colors can be obtained. For example, a white emission light source of combining luminescence elements of blue and yellow luminescence elements, and a white emission light source of combining luminescence elements of blue, green and red are exemplified.

EXAMPLES

Hereinafter, the present invention will be further described in detail with reference to specific Examples, however, the present invention is not limited thereto.

Example 1

Preparation of
Fine-Particle-Containing-Layer-Forming Liquid

Propylene glycol monomethylether acetate (PGMEA, produced by Wako Junyaku Co., Ltd.) and dipentaerythritol hexaacrylate (DPHA, n=1.54, produced by Nippon Kayaku Co., Ltd.) were mixed at a mass ratio of 17:3 to prepare a DPHA solution. To 1 part by mass of the DPHA solution, 0.05 parts by mass of a titanium oxide fine particle having a weight average primary particle diameter of 10 nm (n=2.4, produced by Ishihara Sangyo Kaisha Ltd.) and 0.1 parts by mass of polyglycerin fatty acid ester (produced by Riken Vitamin Co., Ltd.) were added to prepare a titanium-oxide-fine-particle-dispersion liquid using a disper. To 1 part by mass of the titanium-oxide-fine-particle-dispersion liquid, 0.05 parts by mass of a titanium oxide fine particle having a weight average primary particle diameter of 300 nm (n=2.6, produced by Ishihara Sangyo Kaisha Ltd.) and 0.005 parts by mass of SOLSPERSE 36000 were added, followed by an ultrasonic dispersion treatment, thereby preparing a fine-particle-containing-layer-forming liquid.

<Formation of Fine Particle Containing Layer>

On a glass substrate of 300 μm in thickness, the fine-particle-containing-layer-forming liquid thus prepared was film-formed by spin-coating and dried at 200° C. As a result, a fine particle containing layer having a thickness of 600 nm was formed. The thus formed fine particle containing layer was observed by a transmission electron microscope (TEM) and found that both of the two types of the titanium oxide fine particles each having a different particle diameter were dispersed as primary particles.

<Production of Organic Electroluminescence Display Device>

On the fine particle containing layer formed on the glass substrate, an ITO was formed by vacuum vapor deposition to form an ITO electrode (anode) having a thickness of 100 nm.

On the ITO electrode (anode), an organic compound layer was formed (a hole injection layer, a hole transporting layer, a light emitting layer and an electron injection layer were formed in this order). First, as the hole injection layer, 2-TNATA [4,4',4''-tris(2-naphthylphenylamino)triphenylamine] was formed in a thickness of 50 nm by vacuum vapor deposition. Further, as the hole transporting layer, α-NPD [N,N'-(dinaphthylphenylamino)pyrene] was formed in a thickness of 50 nm by vacuum vapor deposition. Further, as the light emitting layer, Alq3[8-quinolinol aluminum complex] was formed in a thickness of 50 nm by vacuum vapor deposition. Finally, as the electron injection layer, a pyridine derivative was formed in a thickness of 25 nm by vacuum vapor deposition. (Average refractive index of the organic compound layer: 1.80)

Afterward, as a reflective cathode, Al was formed in a thickness of 100 nm by vacuum vapor deposition.

Furthermore, the laminate thus formed was glass-sealed in the presence of nitrogen, thereby producing a bottom emission type organic EL display device.

<Measurement of Overall Light Intensity>

An integrating sphere device equipped with a photo-sensor was attached to the thus produced organic electroluminescence display device. Then, a 5 V-voltage was applied to the organic EL display device to allow it to emit light, and the overall amount of light emitted at its light extraction surface was measured. Specifically, a relative overall light intensity thereof (an overall light intensity when the overall light amount of the after-mentioned organic EL display device of Comparative Example 1 was regarded as "1") was found to be 1.5.

Note that a refractive index $n_1$ of the PGMEA and DPHA to which the titanium oxide fine particle having a weight average primary particle diameter of 10 nm had been added was measured using an elipsometer (manufactured by J. A. WOOLAM Company) in the following manner and was found to be 1.63.

In Example 1, the refractive index $n_1$ (refractive index: 1.63) of the PGMEA and DPHA to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.63) of the PGMEA and DPHA to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 1

A bottom emission type organic EL display device was produced in the same manner as in Example 1, except that instead of using, as the fine-particle-containing-layer-forming liquid, the DPHA solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the DPHA solution itself was used without addition thereof. Then, an overall light intensity of the organic EL display device was measured.

Example 2

A bottom emission type organic EL display device was produced in the same manner as in Example 1, except that instead of forming the ITO (refractive index: about 1.9) by vacuum vapor deposition on the fine particle containing layer formed on the glass substrate to form the ITO electrode (anode) having a thickness of 100 nm, an acrylic resin (produced by JSR Corporation) was spin-coated on the fine particle containing layer formed on the glass substrate to form an acrylic-resin flattening film having a thickness of 600 nm, and an ITO (refractive index: about 1.9) was formed by vacuum vapor deposition on the acrylic-resin flattening film to form an ITO electrode (anode) having a thickness of 100 nm. Then, an overall light intensity of the organic EL display device was measured. As a result, a relative overall light intensity thereof (an overall light intensity when the overall light amount of the after-mentioned organic EL display device of Comparative Example 2 was regarded as "1") was found to be 1.4.

Note that in Example 2, the refractive index $n_1$ (refractive index: 1.63) of the PGMEA and DPHA to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.63) of the PGMEA and DPHA to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 2

A bottom emission type organic EL display device was produced in the same manner as in Example 2, except that instead of using, as the fine-particle-containing-layer-forming liquid, the DPHA solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the DPHA solution itself was used without addition thereof. Then, an overall light intensity of the organic EL display device was measured.

Example 3

An organic EL display device was produced in the same manner as in Example 1, except that instead of film-forming the prepared fine-particle-containing-layer-forming liquid by spin-coating on the glass substrate, on a glass substrate on which Ag had been preliminarily film-formed in thickness 100 nm by vacuum vapor deposition, the fine-particle-containing-layer-forming liquid was film-formed by spin-coating; and instead of film-forming, as a reflective cathode, Al of 100 nm in thickness by vacuum vapor deposition in Example 1, an ITO was formed in a thickness of 100 nm by vacuum vapor deposition as a transparent electrode layer. Then, an overall light intensity of the organic EL display device was measured. As a result, a relative overall light intensity thereof (an overall light intensity when the overall light amount of the after-mentioned organic EL display device of Comparative Example 3 was regarded as "1") was found to be 1.6.

Note that in Example 3, the refractive index $n_1$ (refractive index: 1.63) of the PGMEA and DPHA to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.63) of the PGMEA and DPHA to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 3

A top emission type organic EL display device was produced in the same manner as in Example 3, except that instead of using, as the fine-particle-containing-layer-forming liquid, the DPHA solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the DPHA solution itself was used without addition thereof. Then, an overall light intensity of the organic EL display device was measured.

Example 4

Preparation of Fine-Particle-Containing-Layer-Forming Liquid

Propylene glycol monomethylether acetate (PGMEA) and dipentaerythritol hexaacrylate (DPHA, n=1.54) were mixed at a mass ratio of 17:3 to prepare a DPHA solution. To 1 part by mass of the DPHA solution, 0.05 parts by mass of a titanium oxide fine particle (n=2.4) having a weight average primary particle diameter of 10 nm, and 0.1 parts by mass of polyglycerin fatty acid ester were added to prepare a titanium-oxide-fine-particle-dispersion liquid using a disper. To 1 part by mass of the titanium-oxide-fine-particle-dispersion liquid, 0.01 parts by mass of a titanium oxide fine particle (n=2.6) having a weight average primary particle diameter of 300 nm and 0.001 parts by mass of SOLSPERSE 36000 were added, followed by an ultrasonic dispersion treatment, thereby preparing a fine-particle-containing-layer-forming liquid.

<Formation of Fine Particle Containing Layer>

On a glass substrate of 300 μm in thickness, on which Ag had been previously film-formed, as a refractive electrode, in a thickness of 100 nm, the fine-particle-containing-layer-forming liquid thus prepared was film-formed by an applicator and dried at 200° C. As a result, a fine particle containing layer having a thickness of 5 nm was formed. The thus formed fine particle containing layer was observed by a transmission electron microscope (TEM) and found that both of the two types of the titanium oxide fine particles each having a different particle diameter were dispersed as primary particles.

<Production of Organic Electroluminescence Display Device>

On the fine particle containing layer formed on the glass substrate, an ITO (refractive index: about 1.9) was formed by vacuum vapor deposition to form an ITO electrode (anode) having a thickness of 100 nm.

Further, on the ITO electrode (anode), an organic compound layer was formed (a hole injection layer, a hole transporting layer, a light emitting layer and an electron injection layer were formed in this order). First, as the hole injection layer, 2-TNATA [4,4',4"-tris(2-naphthylphenylamino)triphenylamine] was formed in a thickness of 50 nm by vacuum vapor deposition. Further, as the hole transporting layer, α-NPD [N,N'-(dinaphthylphenylamino)pyrene] was formed in a thickness of 50 nm by vacuum vapor deposition. Further, as the light emitting layer, Alq3[8-quinolinol aluminum complex] was formed in a thickness of 50 nm by vacuum vapor deposition. Finally, as the electron injection layer, a pyridine derivative was formed in a thickness of 25 nm by vacuum vapor deposition.

Afterward, as a transparent electrode layer, an ITO was film-formed in a thickness of 100 nm by vacuum vapor deposition.

Furthermore, the laminate thus formed was glass-sealed in the presence of nitrogen, thereby producing a top emission type organic EL display device.

<Measurement of Overall Light Intensity>

An integrating sphere device equipped with a photo-sensor was attached to the thus produced organic electroluminescence display device. Then, a 5 V-voltage was applied to the organic EL display device to allow it to emit light, and the overall amount of light emitted at its light extraction surface was measured. Specifically, a relative overall light intensity thereof (an overall light intensity when the overall light amount of the after-mentioned organic EL display device of Comparative Example 4 was regarded as "1") was found to be 1.45.

Note that a refractive index $n_1$ of the PGMEA and DPHA to which the titanium oxide fine particle having a weight average primary particle diameter of 10 nm had been added was measured and was found to be 1.63.

In Example 4, the refractive index $n_1$ (refractive index: 1.63) of the PGMEA and DPHA to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.63) of the PGMEA and DPHA to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 4

A top emission type organic EL display device was produced in the same manner as in Example 4, except that instead of using, as the fine-particle-containing-layer-forming liquid, the DPHA solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the DPHA solution itself was used without addition thereof. Then, an overall light intensity of the organic EL display device was measured.

Example 5

A bottom emission type organic EL display device was produced in the same manner as in Example 1, except that instead of adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a titanium-oxide-fine-particle-dispersion liquid using a disper and adding 0.05 parts by mass of the titanium oxide fine particle (n=2.6) having a weight average primary particle diameter of 300 nm and 0.005 parts by mass of SOLSPERSE 36000 to 1 part by mass of the titanium-oxide-fine-particle-dispersion liquid, followed by an ultrasonic dispersion treatment to thereby prepare a fine-particle-containing-layer-forming liquid, 0.1 parts by mass of a zirconia fine particle (n=2.1) having a weight average primary particle diameter of 20 nm and 0.2 parts by mass of a carboxylic acid surfactant were added to 1 part by mass of the DPHA solution to prepare a zirconia-fine-particle-dispersion liquid using a disper and adding 0.01 parts by mass of a titanium oxide fine particle (n=2.6) having a weight average primary particle diameter of 300 nm and 0.001 parts by mass of SOLSPERSE 36000 were added to 1 part by mass of the zirconia-fine-particle-dispersion liquid, followed by an ultrasonic dispersion treatment, thereby preparing a fine-particle-containing-layer-forming liquid. Then, an overall light intensity of the organic EL display device was measured. As a result, a relative overall light intensity thereof (an overall light intensity when the overall light amount of the after-mentioned organic EL display device of Comparative Example 5 was regarded as "1") was found to be 1.5.

Note that a refractive index $n_1$ of the PGMEA and DPHA to which the zirconia fine particle having a weight average primary particle diameter of 20 nm had been added was measured using an elipsometer (manufactured by J. A. WOOLAM Company) and found to be 1.64.

In Example 5, the refractive index $n_1$ (refractive index: 1.64) of the PGMEA and DPHA to which the zirconia fine particle having a weight average primary particle diameter of 20 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.64) of the PGMEA and DPHA to which the zirconia fine particle having a weight average primary particle diameter of 20 nm had been added and a refractive index $n_3$ (refractive index: 2.6) of the titanium oxide fine particle having a greater particle diameter than that of the zirconia fine particle satisfy 25 a relationship $n_3-n_1>0.2$.

Comparative Example 5

A bottom emission type organic EL display device was produced in the same manner as in Example 5, except that instead of using, as the fine-particle-containing-layer-forming liquid, the DPHA solution into which the zirconia fine particle having a weight average primary particle diameter of 20 nm, the carboxylic acid surfactant, the titanium oxide fine particle having a weight average primary particle diameter of 300 nm and SOLSPERSE 36000 had been added, the DPHA solution itself was used without addition thereof. Then, an overall light intensity of the organic EL display device was measured.

Example 6

A bottom emission type organic EL display device was produced in the same manner as in Example 1, except that instead of mixing the propylene glycol monomethylether acetate (PGMEA) and dipentaerythritol hexaacrylate (DPHA, n=1.54) at a mass ratio of 17:3 to prepare a DPHA solution and adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a titanium-oxide-fine-particle-dispersion liquid using a disper, propylene glycol monomethylether acetate (PGMEA) and polybenzoxazole (n=1.6) were mixed at a mass ratio of 17:3 to prepare a polybenzoxazole solution, and 0.03 parts by mass of the titanium oxide fine particle (n=2.4) having a weight average primary particle diameter of 10 nm and 0.06 parts by mass of polyglycerin fatty acid ester were added to 1 part by mass of the polybenzoxazole solution to thereby prepare a titanium-oxide-fine-particle-dispersion liquid using a disper. Then, an overall light intensity of the organic EL display device was measured. As a result, a relative overall light intensity thereof (an overall light intensity when the overall light amount of the after-mentioned organic EL display device of Comparative Example 6 was regarded as "1") was found to be 1.5.

A refractive index $n_1$ of the PGMEA and polybenzoxazole to which the titanium oxide fine particle having a weight average primary particle diameter of 10 nm had been added was measured using an elipsometer and found to be 1.67.

In Example 6, the refractive index $n_1$ (refractive index: 1.67) of the PGMEA and polybenzoxazole to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.67) of the PGMEA and polybenzoxazole to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 6

A top emission type organic EL display device was produced in the same manner as in Example 6, except that instead of using, as the fine-particle-containing-layer-forming liquid, the polybenzoxazole solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the polybenzoxazole solution itself was used without addition thereof. Then, an overall light intensity of the organic EL display device was measured.

Comparative Example 7

A bottom emission type organic EL display device was produced in the same manner as in Example 1, except that instead of adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a titanium-oxide-fine-particle-dispersion liquid using a disper and adding 0.05 parts by mass of the titanium oxide fine particle (n=2.6) having a weight average primary particle diameter of 300 nm and 0.005 parts by mass of SOLSPERSE 36000 to 1 part by mass of the titanium-oxide-fine-particle-dispersion liquid, followed by an ultrasonic dispersion treatment to thereby prepare a fine-particle-containing-layer-forming liquid, 0.01 parts by mass of a titanium oxide fine particle (n=2.6) having a weight average primary particle diameter of 300 nm and 0.001 parts by mass of SOLSPERSE 36000 were added to 1 part by mass of the DPHA solution, followed by an ultrasonic dispersion treatment to prepare a fine particle dispersion liquid using a disper. Then, an overall light intensity of the organic EL display device was measured. As a result, a relative overall light intensity thereof (an overall light intensity when the overall light amount of the organic EL display device of Example 1 was regarded as "1") was found to be 0.85.

Reference Example 1

A bottom emission type organic EL display device was produced in the same manner as in Example 1, except that instead of adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a titanium-oxide-fine-particle-dispersion liquid using a disper and adding 0.05 parts by mass of the titanium oxide fine particle (n=2.6) having a weight average primary particle diameter of 300 nm and 0.005 parts by mass of SOLSPERSE 36000 to 1 part by mass of the titanium-oxide-fine-particle-dispersion liquid, followed by an ultrasonic dispersion treatment to thereby prepare a fine-particle-containing-layer-forming liquid, 0.05 parts by mass of a titanium oxide fine particle (n=2.4) having a weight average primary particle diameter of 10 nm were added to 1 part by mass of the DPHA solution to prepare a titanium-oxide-fine-particle-dispersion liquid using a disper, and 0.05 parts by mass of a titanium oxide fine particle (n=2.6) having a weight average primary particle diameter of 300 nm were added to 1 part by mass of the titanium-oxide-fine-particle-dispersion liquid, followed by an ultrasonic dispersion treatment to thereby prepare a fine-particle-containing-layer-forming liquid. Then, an overall light intensity of the organic EL display device was measured. As a result, it was found that both of the two types of the titanium oxide fine particles each having a different particle diameter aggregated and were not dispersed as primary particles. Also, a relative overall light intensity thereof (an overall light intensity when the overall light amount of the organic EL display device of Example 1 was regarded as "1") was found to be 0.7.

A refractive index $n_1$ of the PGMEA and DPHA to which the titanium oxide fine particles had been added was measured using an elipsometer and was found to be 1.63.

Example 7

A bottom emission type organic EL display device was produced in the same manner as in Example 1, except that instead of adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a fine-particle-containing-layer-forming liquid, 0.01 parts by mass of a titanium oxide fine particle (n=2.4) having a diameter of 10 nm and 0.02 parts by mass of polyglycerin fatty acid ester were added to 1 part by mass of the DPHA solution to prepare a titanium-oxide-fine-particle-dispersion liquid using a disper, followed by an ultrasonic dispersion treatment to thereby prepare a fine-particle-containing-layer-forming liquid. Then, an overall light intensity of the organic EL display device was measured. As a result, a relative overall light intensity thereof (an overall light intensity when the overall light amount of the organic EL display device of Comparative Example 1 was regarded as "1") was found to be 1.4.

In Example 7, a refractive index $n_1$ (refractive index: 1.56) of the PGMEA and polybenzoxazole to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.56) of the PGMEA and polybenzoxazole to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Example 8

A bottom emission type organic EL display device was produced in the same manner as in Example 1, except that instead of preparing the DPHA solution in which propylene glycol monomethylether acetate (PGMEA) and dipentaerythritol hexaacrylate (DPHA, n=1.54) were mixed at a mass ratio of 17:3 and adding 0.05 parts by mass of the titanium oxide fine particle (n=2.4) having a weight average primary particle diameter of 10 nm and 0.1 parts by mass of polyglycerin fatty acid ester to 1 part by mass of the DPHA solution to prepare a titanium-oxide-fine-particle-dispersion liquid using a disper, a solution of a polypentabromobenzyl methacrylate-glycidyl methacrylate copolymer was prepared in which propylene glycol monomethylether acetate (PGMEA) and a polypentabromobenzyl methacrylate-glycidyl methacrylate copolymer (n=1.6) were added at a mass ratio of 17:3, 0.05 parts by mass of a titanium oxide fine particle (n=2.4) having a weight average primary particle diameter of 10 nm and 0.1 parts by mass of polyglycerin fatty acid ester were added to 1 part by mass of the solution of the polypentabromobenzyl methacrylate-glycidyl methacrylate copolymer to prepare a titanium-oxide-fine-particle-dispersion liquid using a disper. Then, an overall light intensity of the organic EL display device was measured. As a result, a relative overall light intensity thereof (an overall light intensity when the overall light amount of the after-mentioned organic EL display device of Comparative Example 8 was regarded as "1") was found to be 1.65.

In Example 8, a refractive index $n_1$ of the PGMEA and polypentabromobenzyl methacrylate-glycidyl methacrylate copolymer to which the titanium oxide fine particle having a weight average primary particle diameter of 10 nm had been added was measured using an elipsometer and found to be 1.77.

In Example 8, a refractive index $n_1$ (refractive index: 1.77) of the PGMEA and polypentabromobenzyl methacrylate-glycidyl methacrylate copolymer to which the titanium oxide fine particle having a weight average primary particle diameter of 10 nm had been added and an average refractive index $n_2$ (refractive index: 1.80) of the organic compound layer containing Alq3[8-quinolinol aluminum complex] satisfy a relationship $|n_1-n_2|<0.25$, and the refractive index $n_1$ (refractive index: 1.77) of the PGMEA and polypentabromobenzyl methacrylate-glycidyl methacrylate copolymer to which the titanium oxide fine particle having a weight average primary particle diameter of 10 nm had been added and a refractive index $n_3$ (refractive index: 2.6) of the titanium oxide fine particle having a greater particle diameter than that of the former titanium oxide fine particle satisfy a relationship $n_3-n_1>0.2$.

Comparative Example 8

A bottom emission type organic EL display device was produced in the same manner as in Example 8, except that instead of using, as the fine-particle-containing-layer-forming liquid, the polypentabromobenzyl methacrylate-glycidyl methacrylate copolymer solution into which the titanium oxide fine particle having a weight average primary particle diameter of 10 nm, the polyglycerin fatty acid ester, the titanium oxide fine particle having a weight average primary particle diameter of 300 nm and SOLSPERSE 36000 had been added, the polypentabromobenzyl methacrylate-glycidyl methacrylate copolymer solution itself was used without addition thereof. Then, an overall light intensity of the organic EL display device was measured.

The above results demonstrated that it is possible for the organic EL display devices of Examples 1 to 8, in which a refractive index $n_1$ of the organic resin material to which the first fine particle is previously added and an average refractive index $n_2$ of the organic compound layer satisfy a relationship $|n_1-n_2|<0.25$, and the refractive index $n_1$ of the organic resin material to which the first fine particle is previously added and a refractive index $n_3$ of the second fine particle satisfy a relationship $n_3-n_1>0.2$, to improve the light extraction efficiency.

The organic electroluminescence display device of the present invention can improve light extraction efficiency, has high luminance, and is suitably used as any of a bottom emission type organic EL display device and a top emission type organic EL display device. For example, it can be suitably used for organic EL illumination.

In addition, the fine particle containing layer in the organic electroluminescence display device of the present invention can also be used for inorganic electroluminescence display devices.

What is claimed is:

1. An organic electroluminescence display device comprising:
    an organic electroluminescence element which comprises a transparent electrode, a counter electrode, and an organic compound layer provided between the transparent electrode and the counter electrode, the organic compound layer including a light emitting layer, and
    a fine-particle-containing-layer positioned in the optical path of light emitted from the light emitting layer,
    wherein the fine-particle-containing-layer contains an organic resin material, a first fine particle, and a second fine particle having a weight average particle diameter greater than that of the first fine particle,
    wherein a refractive index $n_1$ of the organic resin material into which the first fine particle is added and an average refractive index $n_2$ of the organic compound layer satisfy a relationship $|n_1-n_2|<0.25$, and
    wherein the refractive index $n_1$ of the organic resin material into which the first fine particle is added and a refractive index $n_3$ of the second fine particle satisfy a relationship $n_3-n_1>0.2$.

2. The organic electroluminescence display device according to claim 1, wherein the second particle is an inorganic fine particle.

3. The organic electroluminescence display device according to claim 2, wherein the inorganic fine particle contains at least one selected from $TiO_2$, $ZnO$, and $ZrO_2$.

4. The organic electroluminescence display device according to claim 1, wherein the fine particle containing layer has a thickness of less than 5 μm.

5. The organic electroluminescence display device according to claim 1, wherein the fine particles in the fine-particle-containing-layer are primary particles.

6. The organic electroluminescence display device according to claim 5, wherein the fine particles in the fine-particle-containing-layer are surface-treated with an organic material.

7. The organic electroluminescence display device according to claim 1, wherein the fine particle containing layer further contains a fine particle dispersant.

8. The organic electroluminescence display device according to claim 1, wherein the weight average particle diameter of the first fine particle is less than 50 nm, and the weight average particle diameter of the second fine particle is 50 nm to 5 µm.

9. The organic electroluminescence display device according to claim 1, wherein the organic resin material contains at least one selected from imide resins, acrylic resins, ether resins, and silane resins.

* * * * *